(12) United States Patent
Rau et al.

(10) Patent No.: US 11,643,425 B2
(45) Date of Patent: May 9, 2023

(54) ORGANOMETALLIC COMPOUNDS FOR THE MANUFACTURE OF A SEMICONDUCTOR ELEMENT OR ELECTRONIC MEMORY

(71) Applicant: UMICORE AG & CO. KG, Hanau-Wolfgang (DE)

(72) Inventors: Nicholas Rau, Marburg (DE); Jörg Sundermeyer, Marburg (DE); Henrik Schumann, Weinbach (DE); Andreas Rivas Nass, Bensheim (DE); Annika Frey, Hanau (DE); Wolf Schorn, Waldbronn (DE); Eileen Woerner, Nidderau (DE); Ralf Karch, Kleinostheim (DE); Angelino Doppiu, Seligenstadt (DE)

(73) Assignee: UMICORE AG & CO. KG, Hanau-Wolfgang (DE)

( * ) Notice: Subject to any disclaimer, the term of this patent is extended or adjusted under 35 U.S.C. 154(b) by 0 days.

(21) Appl. No.: 17/263,200

(22) PCT Filed: Jul. 26, 2019

(86) PCT No.: PCT/EP2019/070212
§ 371 (c)(1),
(2) Date: Jan. 26, 2021

(87) PCT Pub. No.: WO2020/021083
PCT Pub. Date: Jan. 30, 2020

(65) Prior Publication Data
US 2021/0206790 A1    Jul. 8, 2021

(30) Foreign Application Priority Data

Jul. 27, 2018  (EP) .................................... 18186142
Jul. 30, 2018  (DE) ..................... 10 2018 005 931.7

(51) Int. Cl.
| C07F 15/00 | (2006.01) |
| C23C 16/18 | (2006.01) |
| C23C 16/455 | (2006.01) |
| H01L 21/02 | (2006.01) |

(52) U.S. Cl.
CPC .......... *C07F 15/0046* (2013.01); *C23C 16/18* (2013.01); *C23C 16/45553* (2013.01); *H01L 21/0228* (2013.01)

(58) Field of Classification Search
CPC .................................................. C07F 15/0046
See application file for complete search history.

(56) References Cited

U.S. PATENT DOCUMENTS

| 3,723,178 A | 3/1973 | Sohlbarand |
| 8,716,509 B2 * | 5/2014 | Doppiu ................... C23C 16/18 |
| | | 556/136 |
| 9,349,601 B2 | 5/2016 | Tada et al. |
| 2010/0113814 A1 * | 5/2010 | Touge ................. C07F 15/0046 |
| | | 556/136 |
| 2012/0073660 A1 | 3/2012 | Chi et al. |
| 2012/0277456 A1 * | 11/2012 | Doppiu .................... B01J 31/00 |
| | | 556/136 |
| 2013/0296567 A1 * | 11/2013 | Chi ....................... C07D 231/12 |
| | | 548/266.2 |

(Continued)

FOREIGN PATENT DOCUMENTS

| DE | 20 12 031 A1 | 9/1971 |
| KR | 10-2014-0138085 A | 12/2014 |
| TW | 201443067 A | 11/2014 |

(Continued)

OTHER PUBLICATIONS

M. Bennett et al., 2 Journal of the Chemical Society, Dalton Transactions: Inorganic Chemistry, 233-241 (1974) (Year: 1974).*
W. Euler et al., 20 Polyhedron, 507-514 (2001) (Year: 2001).*
Hawley's Condensed Chemical Dictionary, p. 114 (16th ed., 2016, R.J. Larrañaga ed.) (Year: 2016).*
Bennett, M.A, et al. Arene Ruthenium(II) Complexes formed by Dehydrogenation of Cyclohexadienes with Ruthenium(III) Trichloride. J. Chem. Soc., Dalton Trans. 1974. vol. 2, pp. 233-241.
Cernohorsky, M. The ratio method for absolute measurements of lattice parameters with cylindrical cameras. Acta Cryst. 1960. vol. 13, pp. 823-826.
Mistryukov, E. A. Facile and scalable synthesis of imidazolium halides using dimethylmethyleneammonium salts as ring closing reagents. Mendeleev Communications 2006. vol. 16, No. 5, pp. 258-259.

(Continued)

*Primary Examiner* — Alexander R Pagano
(74) *Attorney, Agent, or Firm* — Smith, Gambrell & Russell, LLP

(57) ABSTRACT

The invention relates to compounds in accordance with the general formula [Ru(arene)($R^a$—N=$CR^1$—$CR^3$=N—$R^b$)] or [Ru(arene)(($R^c$,$R^d$)N—N=$CR^{H1}$—$CR^{H3}$=N—N($R^e$, $R^f$))]. In this case, arene is selected from the group consisting of mononuclear and polynuclear arenes and heteroarenes. $R^1$, $R^3$, $RH^1$, $R^{H3}$ and $R^a$-$R^f$ are independently selected from the group consisting of H, an alkyl radical (C1-C10) and an aryl radical. It further relates to methods for the production of these compounds, compounds obtainable according to these methods, their use and a substrate having on a surface thereof a ruthenium layer or a layer containing ruthenium. In addition, the invention relates to a method for producing compounds [Ru(arene)$X_2$]2, wherein arene is selected from the group consisting of mononuclear and polynuclear arenes and X=halogen, compounds of this type obtainable according to this method, and their use. The aforementioned ruthenium(O) compounds can be produced in a simple, cost-effective and reproducible manner with a high degree of purity and good yield. Due to their high degree of purity, they are suitable for use as ruthenium(O) precursors.

15 Claims, 4 Drawing Sheets

(56) References Cited

U.S. PATENT DOCUMENTS

Figure 1:
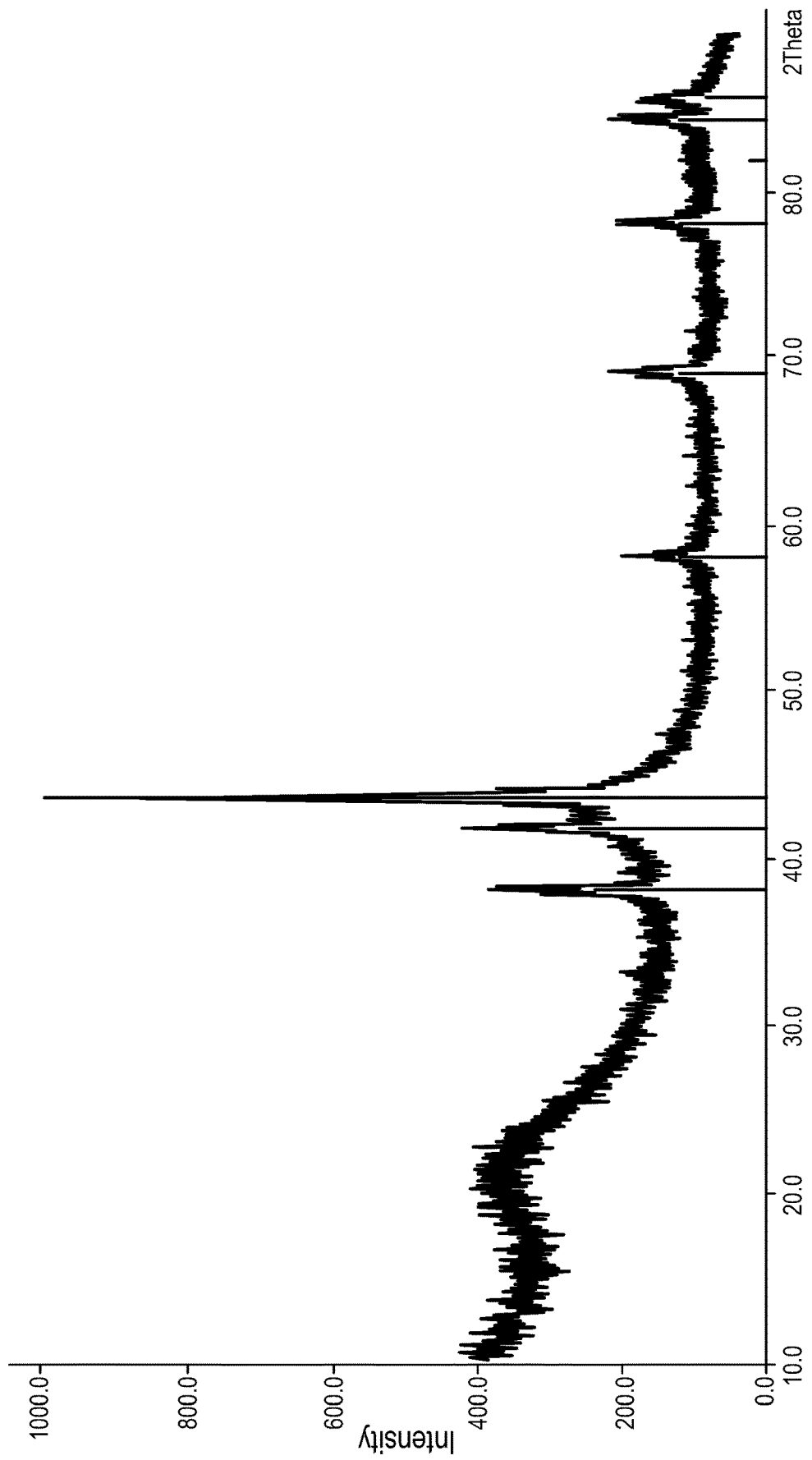

2021/0269914 A1* 9/2021 Väyrynen ................ C23C 16/06

FOREIGN PATENT DOCUMENTS

WO          2013/117955 A1     8/2013
WO      WO-2014189340 A1 * 11/2014 .......... C07F 15/0046

OTHER PUBLICATIONS

Mino, T., et al. Phosphine-Free Palladium Catalyzed Mizoroki-Heck Reaction Using Hydrazone as a Ligand. J. Org. Chem. 2006. vol. 71, pp. 6834-6839.

International Preliminary Report on Patentability dated Feb. 2, 2021 for International Patent Application No. PCT/EP2019/070212 (15 pages).

Written Opinion dated Oct. 29, 2019 for International Patent Application No. PCT/EP2019/070212 (14 pages).

International Search Report dated Oct. 29, 2019 for International Patent Application No. PCT/EP2019/070212 (6 pages).

Dieck, H.T., et al. Ruthenium Complexes with Diazadienes. 4.[1] Arene Diazadiene Ruthenium(II) Complexes [$\eta^6$-Arene)(RN=CR'—CR'=NR)Ru(L)]$^n$+(n=1, L=CL, I, Alkyl; n=2, L = MeCN, $\eta^2$-$C^2H^4$) and Arene Diazadiene Ruthenium (0). Organometallics. 1986. vol. 5, pp. 1449-1457.

Le Bozec, H., et al. Organometallic Chemistry of Arene Ruthenium and Osmium Complexes. Advances in Organometallic Chemistry. 1989. vol. 29, pp. 163-247.

Taiwanese Examination Report dated Feb. 15, 2023 for Taiwanese Patent Application No. 108126682 (10 pages in Chinese with English translation).

* cited by examiner

ORGANOMETALLIC COMPOUNDS FOR THE MANUFACTURE OF A SEMICONDUCTOR ELEMENT OR ELECTRONIC MEMORY

The invention relates to compounds of the type [Ru(arene)($R^a$—N=$CR^1$—$CR^3$=N—$R^b$)] and [Ru(arene)(($R^c$, $R^d$)N—N=$CR^{H1}$—$CR^{H3}$=N—N($R^e$,$R^f$))], wherein arene is selected from the group consisting of mononuclear and polynuclear arenes and mononuclear and polynuclear heteroarenes and $R^1$, $R^3$, $R^{H1}$, $R^{H3}$ and $R^a$-$R^f$ are independently selected from the group consisting of H, an alkyl radical (C1-C10) and an aryl radical, their use and a substrate having on a surface thereof a ruthenium layer or a layer containing ruthenium. It further relates to methods for the production of these ruthenium(0) compounds, ruthenium(0) compounds obtainable according to these methods, their use and a substrate having on a surface thereof a ruthenium layer or a layer containing ruthenium. Furthermore, the invention relates to a method for producing compounds of the type [Ru(arene)$X_2$]$_2$, wherein arene is selected from the group consisting of mononuclear and polynuclear arenes and X=halogen, compounds of the type [Ru(arene)$X_2$]$_2$, obtainable according to this method, and their use.

Compounds of the type [Ru(arene)(R—N=$CR^x$—$CR^y$=N—R)] and methods for their production are known in the prior art. Some volatile representatives of this group of ruthenium(0) complexes are used as ruthenium precursors in processes for the deposition of ruthenium layers and/or layers containing ruthenium. For the production of ruthenium layers or ruthenium films, vapor deposition methods or sol-gel processes are typically used.

The preparation of compounds of the type [Ru(arene)(R—N=$CR^x$—$CR^y$=N—R)] takes place in the prior art according to the route described by tom Dieck et al., among others. (*Organometallics* 1986, 5, 1449-1457). According to tom Dieck et al., the ruthenium(II) complex [Ru($C_6H_6$)$Cl_2$]$_2$ is reacted with $AgBF_4$ and R—N=$CR^x$—$CR^y$=N—R ($^R$DAD, diazadiene) in a first step to form the salt [Ru($C_6H_6$)($^R$DAD)Cl][$BF_4$] (see FIG. 1).

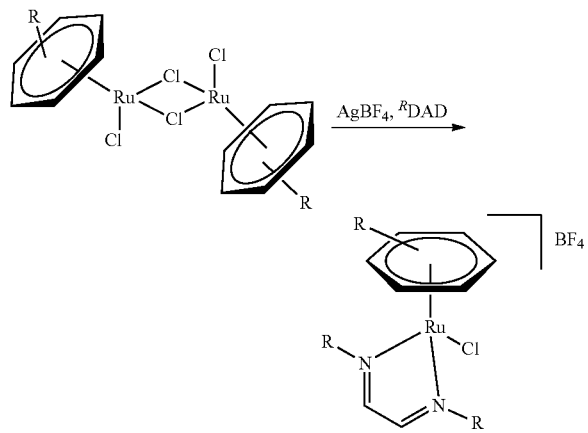

FIG. 1: Preparation of [Ru(arene)($^R$DAD)Cl][$BF_4$] as an educt for [Ru(arene)($^R$DAD)].

In a second step, the ruthenium(II) salt [Ru($C_6H_6$)($^R$DAD)Cl][$BF_4$] is reduced with sodium naphthalide to form the ruthenium(0) complex [Ru($C_6H_6$)($^R$DAD)]. Alternatively, tom Dieck et al. presents the direct reaction of [Ru($C_6H_6$)$Cl_2$]$_2$ with sodium naphthalide for selected compounds. In this case, lower yields are achieved than via the first route on the one hand and the separation of the excess reducing agent proves to be difficult in some cases on the other hand. Purification takes place by means of sublimation and recrystallization in each case. The results of the elemental analyses of the complexes of the type [Ru($C_6H_6$)($^R$DAD)] are considered unsatisfactory by the authors themselves.

This synthesis sequence by tom Dieck et al. is also used for the production of the ruthenium(II) compounds of the type [Ru(arene)($^R$DAD)] claimed in WO 2013/117955 A1.

The respective ruthenium(II) complex [Ru(arene)$Cl_2$]$_2$ can, for example, be synthesized according to a specification by Bennett and Smith (*J. Chem. Soc., Dalton Trans.* 1974, 2, 233) in accordance with KR 2014-00138085 A or according to US 2010/0113814 A1.

In accordance with KR 2014-00138085 A, the respective ruthenium(II) complex [Ru(arene)$Cl_2$]$_2$ is reacted, for example, with an alkali metal carbonate in isopropanol or with an elemental alkali metal in ethylene glycol dimethyl ether to form the desired target compound [Ru(arene)($^R$DAD)].

A major disadvantage of the known process controls for the production of ruthenium(0) complexes of the type [Ru(arene)(R—N=$CR^x$—$CR^y$=N—R)] is that, in terms of preparation, they are complex and comparatively cost-intensive. For the first synthesis route according to tom Dieck et al., a total of three steps are provided, wherein $AgBF_4$ and sodium naphthalide are relatively cost-intensive chemicals. With the alternative two-step route according to tom Dieck et al. also with sodium naphthalide as the reducing agent the yields are significantly lower. The target compounds of type [Ru($C_6H_6$)($^R$DAD)] are obtained in insufficient purity according to elemental analyses. In accordance with KR 2014-00138085 A, [Ru(arene)$Cl_2$]$_2$ is also reacted directly to form the desired ruthenium(0) complex so that a total of only two reaction steps are required.

In this case, either alkali metal carbonates or alkali metals are used as reducing agents. The use of alkali metals as reducing agents leads to an increased effort in terms of preparation due to their sensitivity to air and moisture and is disadvantageous in industrial applications for safety reasons. Another disadvantage of the known methods is that the spectrum of complexes of the type [Ru(arene)(R—N=$CR^x$—$CR^y$=N—R)] accessible in pure form is limited, especially with regard to the arene that can be used. Furthermore, the known compounds of the type [Ru(arene)(R—N=$CR^x$—$CR^y$=N—R)] have comparatively high melting points and are therefore relatively difficult to volatilize. In addition to complex and/or cost-intensive process control, several relatively complex purification steps, such as sublimation and recrystallization are, where applicable, required before they can be used as ruthenium(0) precursors. This significantly increases the synthesis effort. In addition, the known synthesis methods for ruthenium(II) compounds of the type [Ru(arene)$Cl_2$]$_2$ are, in terms of preparation, highly elaborate in parts and/or unsatisfactory due to low yield. With the reaction controls described above, the desired ruthenium(0) complexes are thus obtained in total yields that are comparatively low with regard to the industrial use of these compounds.

As a whole, the synthesis routes documented in the literature can be classified as unsatisfactory from ecological and economic perspectives.

The invention is therefore based on the object of overcoming these and other disadvantages of the prior art and of providing methods with which compounds of the type [Ru(arene)(R—N=$CR^x$—$CR^y$=N—R)] and a new class of defined ruthenium(0) compounds can be produced. Thereby, the ruthenium(0) complexes should be prepared simply, comparatively inexpensively and in a reproducible manner with a high degree of purity and good yield. In particular, the purity of the ruthenium(0) complexes is to satisfy the requirements for ruthenium precursors for the production of ruthenium(0) layers and/or layers containing ruthenium(0). In doing so, at least some representatives of the new compound class are to have a comparatively low melting point. The method should also be characterized by the fact that it can also be carried out on an industrial scale with a comparable yield and purity of the target compounds. Furthermore, a substrate that has on one surface a qualitatively satisfactory ruthenium(0) layer or a layer containing ruthenium(0) should be provided. In addition, a method is to be made available with which ruthenium(II) precursors of the type [Ru(arene)Cl$_2$]$_2$ can be prepared simply, comparatively inexpensively and with a high degree of purity and good yield.

The main features of the invention are indicated in claim 1, claim 11, claim 17, claim 18, claim 19, claim 26, claim 28, claim 35, claim 37, claim 39, claim 41 or claim 43. Embodiments are the subject matter of claim 2 to 10, 12 to 16, 20 to 25, 27, 29 to 34, 36, 38, 40 or 42.

The object is achieved by compounds
in accordance with the general formula [Ru(arene)(R$^a$—N=CR$^1$—CR$^3$=N—R$^b$)] (A) wherein
i) arene is selected from the group consisting of mononuclear and polynuclear arenes and mononuclear and polynuclear heteroarenes
and
ii) R$^1$, R$^3$, R$^a$ and R$^b$ are independently selected from the group consisting of H, an alkyl radical (C1-C10) and an aryl radical
or
in accordance with the general formula [Ru(arene)((R$^c$, R$^d$)N—N=CR$^{H1}$—CR$^{H3}$=N—N(R$^e$,R$^f$))] (B) wherein
i) arene is selected from the group consisting of mononuclear and polynuclear arenes and mononuclear and polynuclear heteroarenes
and
ii) R$^{H1}$, R$^{H3}$, R$^c$, R$^d$, R$^e$ and R$^f$ are independently selected from the group consisting of H, an alkyl radical (C1-C10) and an aryl radical.

The general formulas A and B include both the monomers and any oligomers.

The alkyl and/or aryl radicals R$^1$, R$^3$, R$^{H1}$, R$^{H3}$ and R$^a$-R$^f$ may be substituted, for example partially fluorinated or perfluorinated. The mononuclear and polynuclear arenes and the mononuclear and polynuclear heteroarenes may also be substituted.

Examples of the alkyl and aryl radicals R$^1$, R$^3$, R$^{H1}$, R$^{H3}$ and R$^a$-R$^f$ are CH$_3$, C$_2$H$_5$, nPr, iPr, nBu, tBu, sBu, iBu, CH$_2$sBu, CH$_2$iBu, CH(CH$_3$)(iPr), CH(CH$_3$)(nPr), CH(C$_2$H$_5$)$_2$, C(CH$_3$)$_2$(C$_2$H$_5$), C$_6$H$_{11}$ and C$_6$H$_5$.

In general, Arene may be mononuclear and polynuclear benzene derivatives having at least one substituent,
wherein the substituents are independently selected from the group consisting of a halogen atom, an alkoxy radical, an alkyl radical (C1-C10) and an aryl radical,
and
mononuclear and polynuclear heteroarenes.

The heteroarenes may be pyridine, pyridine derivatives, diazines, diazine derivatives, triazines and triazine derivatives. The pyridine derivatives, diazine derivatives and triazine derivatives are triazine, diazine or triazine substituted with one or more, in particular 1 to 4 or 1 to 3 or 1 to 2 substituents. The substituents can be halogen atoms (Cl, F, Br, I), alkoxy or alkyl radicals with 1 to 5, in particular 1 to 5 or 1 to 4, in particular 1 to 3 carbon atoms.

The mononuclear and polynuclear benzene derivatives encompass aromatic rings or ring systems of benzene rings or may be a benzene ring. Examples are, for example, benzene, naphthalene, anthracene, phenanthrene or the like, in particular benzene. They may be substituted with one or more, in particular 1, 2, 3 or 4 substituents. Substituents can be halogen (F, Cl, Br, I), alkoxy, amino or alkyl radicals with 1 to 10, in particular 1 to 6, or 1 to 5, in particular 1 to 4 or 1 to 3 carbon atoms such as CH$_3$, C$_2$H$_5$, nPr, iPr, nBu, tBu, sBu, iBu, CH$_2$sBu, CH$_2$iBu, CH(CH$_3$)(iPr), CH(CH$_3$)(nPr), CH(C$_2$H$_5$)$_2$, C(CH$_3$)$_2$(C$_2$H$_5$), —OCH$_3$, —OC$_2$H$_5$, —OnPr, —OiPr, —OnBu, —OtBu, —O-sBu, —O-iBu, —OCH$_2$sBu, —OCH$_2$iBu, —OCH(CH$_3$)(iPr), —OCH(CH$_3$)(nPr), —OCH(C$_2$H$_5$)$_2$, —OC(CH$_3$)$_2$(C$_2$H$_5$). Suitable examples may include toluene, ethylbenzene, tert-butylbenzene, sec-butylbenzene, propylbenzene, isopropylbenzene, benzocyclopentane, 4-ethyl-toluene, ortho-xylene, meta-xylene, para-xylene, ortho-cymene, meta-cymene, para-cymene, mesitylene, methoxybenzene (anisole), p-methoxytoluene, chlorobenzene, bromobenzene, iodobenzene, neopentylbenzene, aniline, indole, hexamethylbenzene. In a specific embodiment, the arenes as described above can be employed in particular in compounds of general formula B.

The subject matter of the invention does not include compounds in accordance with the general formula A,
wherein arene=benzene or arene=benzene homologues. In this case, the excluded benzene homologues have one to six substituents, wherein the substituents are independently selected from the group consisting of an alkyl radical, an alkylsilyl radical, an alkylamine radical and a fluoroalkyl radical, wherein alkyl=C1-C4.

The compounds claimed of the type [Ru(arene)(R$^a$—N=CR$^1$—CR$^3$=N—R$^b$)] (A) and of the type [Ru(arene)((R$^c$,R$^d$)N—N=CR$^{H1}$—CR$^{H3}$=N—N(R$^e$,R$^f$))] (B) can be prepared in a reproducible manner with good yields and with a high degree of purity. Thus, they are suitable as ruthenium(0) precursors for the deposition of ruthenium layers or layers containing ruthenium on a surface of a substrate, even on an industrial scale. The ruthenium(0) complexes can be prepared starting from ruthenium(II) precursors of the type [Ru(arene)X$_2$]$_2$ in a simple two-step synthesis. It is particularly advantageous that both their synthesis and their purification can be carried out using simple standard methods, i.e. without great effort in terms of preparation. Thus, the ruthenium(0) complexes claimed can be prepared not only simply but also comparatively inexpensively. Based on the range of variation of the substitution patterns of the arene ligands and the two DAD ligands R$^a$—N=CR$^1$—CR$^3$=N—R$^b$ (glyoxal-bis(imine)) and (R$^c$,R$^d$)N—N=CR$^{H1}$—CR$^{H3}$=N—N(R$^e$,R$^f$) (glyoxal-bis(hydrazone)), tailor-made ruthenium(0) precursors can be provided for various applications. Thus, a portfolio of ruthenium(0) complexes is provided, from which a suitable compound can be selected, namely according to the requirements of the respective deposition process in terms of the volatility and thermal degradation of the ruthenium(0) precursor. Due to the presence of a hydrazone unit and consequently a comparatively more labile N—N single bond instead of an N—C single bond as in the case of type A compounds, the complexes of the general formula B have properties different from those of the analogous compounds in accordance with the general formula A. Thus, some representatives of the compound class in accordance with the general formula B have comparatively lower melting points. This makes them even more suitable for use as ruthenium(0) precursors in a vapor deposition process. For example, the compound [Ru(anisole)(iPr—N=CH—CH=N-iPr)] of type A has a melting point at 95.4° C., while the complex [Ru(anisole)(Me$_2$N—N=CH—CH=N—NMe$_2$)] of type B already melts at 70.2° C. Thus, these two compounds also differ in terms of their thermal degradation.

In one embodiment, compounds in accordance with the general formula A are provided, wherein arene is selected from the group consisting of mononuclear and polynuclear benzene derivatives having at least one substituent, wherein the substituents are independently selected from the group consisting of a halogen atom, an NH$_2$ radical, an alkoxy radical, an alkyl radical (C5-C10) and an aryl radical, and mononuclear and polynuclear heteroarenes.

In this case, the benzene derivatives and the heteroarenes are, for example, selected from the group consisting of chlorobenzene, bromobenzene, iodobenzene, neopentylbenzene, aniline, indole, pyridine, pyridine derivatives, diazines, diazine derivatives, triazines and triazine derivatives.

An additional embodiment provides compounds in accordance with the general formula A, wherein $R^1$ and $R^3$ are independently selected from the group consisting of H, an alkyl radical (C1-C10) and an aryl radical and $R^a$=$R^b$=H, alkyl radical (C1-C10) or aryl radical. These are, for example, the compounds [Ru(anisole)(iPr—N=CH—C(CH$_3$)=N-iPr)], [Ru(anisole)(iPr—N=CH—C(C$_6$H$_5$)=N-iPr)], [Ru(anisole)(iPr—N=CH—C(C$_6$H$_{11}$)=N-iPr)], [Ru(p-cymene)(iPr—N=CH—C(CH$_3$)=N-iPr)], [Ru(p-cymene)(iPr-N=CH—C(C$_6$H$_5$)=N-iPr)] and [Ru(p-cymene)(iPr—N=CH—C(C$_6$H$_{11}$)=N-iPr)].

An additional embodiment provides compounds in accordance with the general formula A, wherein $R^1$=$R^3$=H, alkyl radical (C1-C10) or aryl radical and $R^a$=$R^b$=H, alkyl radical (C1-C10) or aryl radical. Examples of these type A compounds are [Ru(anisole)(iPr-N=CH—CH=N-iPr)], [Ru(anisole)(iPr-N=C(CH$_3$)—C(CH$_3$)=N-iPr)], [Ru(anisole)(iPr-N=C(C$_6$H$_5$)—C(C$_6$H$_5$)=N-iPr)], [Ru(anisole)(iPr-N=C(C$_6$H$_{11}$)—C(C$_6$H$_{11}$)=N-iPr)], [Ru(p-cymene)(iPr-N=CH—CH=N-iPr)], [Ru(p-cymene)(iPr-N=C(CH$_3$)—C(CH$_3$)=N-iPr)], [Ru(p-cymene)(iPr-N=C(C$_6$H$_5$)—C(C$_6$H$_5$)=N-iPr)] and [Ru(p-cymene)(iPr—N=C(C$_6$H$_{11}$)—C(C$_6$H$_{11}$)=N-iPr)].

In an additional embodiment, compounds in accordance with the general formula B are provided, wherein $R^{H1}$, $R^{H3}$ are independently selected from the group consisting of H, an alkyl radical (C1-C10) and an aryl radical, and $R^c$=$R^e$=H, alkyl radical (C1-C10) or aryl radical, and $R^d$=$R^f$=H, alkyl radical (C1-C10) or aryl radical.

Examples of these type B complexes are [Ru(anisole)((CH$_3$)HN—N=CH—C(CH$_3$)=N—NH(CH$_3$))], [Ru(anisole)((CH$_3$)HN—N=CH—C(C$_6$H$_5$)=N—NH(CH$_3$))], [Ru(anisole)((C$_6$H$_{11}$)HN—N=CH—C(CH$_3$)=N—NH(C$_6$H$_{11}$))], [Ru(p-cymene)((CH$_3$)HN—N=CH—C(CH$_3$)=N—NH(CH$_3$))], [Ru(p-cymene)((CH$_3$)HN—N=CH—C(C$_6$H$_5$)=N—NH(CH$_3$))] and [Ru(p-cymene)((C$_6$H$_{11}$)HN—N=CH—C(CH$_3$)=N—NH(C$_6$H$_{11}$))].

An additional variant provides compounds in accordance with the general formula B, wherein $R^{H1}$, $R^{H3}$ are independently selected from the group consisting of H, an alkyl radical (C1-C10) and an aryl radical, and $R^c$=$R^d$=$R^e$=$R^f$=H, alkyl radical (C1-C10) or aryl radical.

These compounds of the ruthenium(0) complexes of type B include, for example, [Ru(anisole)((CH$_3$)$_2$N—N=CH—C(CH$_3$)=N—N(CH$_3$)$_2$)], [Ru(anisole)((C$_5$H$_{11}$)$_2$N—N=CH—C(CH$_3$)=N—N(C$_5$H$_{11}$)$_2$)], [Ru(anisole)((C$_6$H$_{11}$)$_2$N—N=CH—C(C$_6$H$_5$)=N—N(C$_6$H$_{11}$)$_2$)], [Ru(p-cymene)((CH$_3$)$_2$N—N=CH—C(CH$_3$)=N—N(CH$_3$)$_2$)], [Ru(p-cymene)((C$_5$H$_{11}$)$_2$N—N=CH—C(CH$_3$)=N—N(C$_5$H$_{11}$)$_2$)] and [Ru(p-cymene)((C$_6$H$_{11}$)$_2$N—N=CH—C(C$_6$H$_5$)=N—N(C$_6$H$_{11}$)$_2$)].

An additional embodiment provides compounds in accordance with the general formula B, wherein $R^{H1}$=$R^{H3}$=H, alkyl radical (C1-C10) or aryl radical, and $R^c$=$R^e$=H, alkyl radical (C1-C10) or aryl radical, and $R^d$=$R^f$=H, alkyl radical (C1-C10) or aryl radical.

Examples of these type B complexes are [Ru(anisole)((CH$_3$)HN—N=CH—CH=N—NH(CH$_3$))], [Ru(anisole)((C$_6$H$_{11}$)HN—N=C(CH$_3$)—C(CH$_3$)=N—NH(C$_6$H$_{11}$))], [Ru(anisole)((C$_5$H$_{11}$)(C$_2$H$_5$)N—N=C(C$_6$H$_5$)—C(C$_6$H$_5$)=N—N(C$_2$H$_5$)(C$_5$H$_{11}$))], [Ru(p-cymene)((CH$_3$)HN—N=CH—CH=N—NH(CH$_3$))], [Ru(p-cymene)((C$_6$H$_{11}$)HN—N=C(CH$_3$)—C(CH$_3$)=N—NH(C$_6$H$_{11}$))] and [Ru(p-cymene)((C$_5$H$_{11}$)(C$_2$H$_5$)N—N=C(C$_6$H$_5$)—C(C$_6$H$_5$)=N—N(C$_2$H$_5$)(C$_5$H$_{11}$))].

In an additional embodiment, compounds in accordance with the general formula B are provided, wherein $R^{H1}$=$R^{H3}$=H, alkyl radical (C1-C10) or aryl radical and $R^c$=$R^d$=$R^e$=$R^f$=H, alkyl radical (C1-C10) or aryl radical. These include, for example, the ruthenium(0) complexes [Ru(anisole)((CH$_3$)$_2$N—N=CH—CH=N—N(CH$_3$)$_2$)], [Ru(anisole)((C$_6$H$_{11}$)$_2$N—N=C(CH$_3$)—C(CH$_3$)=N—N(C$_6$H$_{11}$)$_2$)], [Ru(anisole)((C$_5$H$_{11}$)$_2$N—N=C(C$_6$H$_5$)—C(C$_6$H$_5$)=N—N(C$_5$H$_{11}$)$_2$)], [Ru(p-cymene)((CH$_3$)$_2$N—N=CH—CH=N—N(CH$_3$)$_2$)], [Ru(p-cymene)((C$_6$H$_{11}$)$_2$N—N=C(CH$_3$)—C(CH$_3$)=N—N(C$_6$H$_{11}$)$_2$)] and [Ru(p-cymene)((C$_5$H$_{11}$)$_2$N—N=C(C$_6$H$_5$)—C(C$_6$H$_5$)=N—N(C$_5$H$_{11}$)$_2$)].

In yet another embodiment, compounds in accordance with the general formula B are provided, wherein arene is selected from the group consisting of benzene, toluene, ethyl benzene, tert-butylbenzene, sec-butylbenzene, propylbenzene, isopropylbenzene, benzocyclopentane, 4-ethyl toluene, ortho-xylene, meta-xylene, para-xylene, chlorobenzene, mesitylene, para-cymene, anisole, aniline, pyridine, diazines, triazines, pyridine derivatives, diazine derivatives, triazine derivatives.

An additional variant provides compounds in accordance with the general formula A or the general formula B, wherein mononuclear or polynuclear heteroarenes are selected from the group consisting of pyridine, pyridine derivatives, diazines, diazine derivatives, triazines and triazine derivatives. The introduction of mononuclear and polynuclear N-heterocycles instead of mononuclear and polynuclear arenes significantly expands the spectrum of type A and B ruthenium(0) complexes.

The object is further achieved by a method for producing a compound in accordance with the general formula [Ru(arene)X$_2$]$_2$ (C), wherein arene is selected from the group consisting of mononuclear and polynuclear arenes and mononuclear and polynuclear heteroarenes and X=halogen, comprising the following steps:
a) filling an autoclave with a mixture containing
   a cyclohexadiene,
   a ruthenium(III) halide, and
   a solvent,
b) heating the autoclave to a temperature T.

By using an autoclave, it is advantageously possible to carry out the reaction under increased pressure. For this purpose, only the heating of the autoclave is required.

In one embodiment of the method claimed, the pressure inside the autoclave during the reaction is between 1.1 bars and 30 bars. This can advantageously reduce the reaction time, wherein an improvement of the yield of the product [Ru(arene)X$_2$]$_2$ is also obtained. At a pressure of 5 bars within the autoclave, a temperature of the autoclave of 140° C. and a reaction time of four hours, for example, the target compound [Ru(anisole)Cl$_2$]$_2$ is obtained in a yield of up to 37%, wherein the proportion of the usual unavoidable by-product [Ru(benzene)Cl$_2$]$_2$ has already been subtracted. For this ruthenium(II) complex, Bennett and Smith report a yield of 25% at a reaction time of 30 hours under reflux conditions. The method claimed achieves more satisfactory results from an (atom-) economic and ecological perspective. The product mixture of [Ru(anisole)Cl$_2$]$_2$ and [Ru(benzene)Cl$_2$]$_2$ is typically used—without separation of both complexes—as the educt "[Ru(anisole)Cl$_2$]$_2$" for further reactions.

In one embodiment of the method, the cyclohexadiene is 1,3-cyclohexadiene, 1,4-cyclohexadiene, 1-ethyl-1,4-cyclohexadiene, 2-methyl-5-(1-methylethyl)-1,3-cyclohexadiene, 1,3,5-trimethylcyclohexa-1,4-diene or 1-methoxycyclohexa-1,4-diene.

In an additional embodiment of the method, the ruthenium(III) halide is a ruthenium(III) chloride, a ruthenium(III) bromide or a ruthenium(III) iodide. Unless otherwise commercially available, ruthenium(III) halides are used as $RuX_3 \times H_2O$ without prior drying.

In an additional embodiment of the method, the solvent is a polar solvent. The solvent can also be a mixture of solvents. One variant of the method provides that the solvent is an alcohol, acetonitrile, acetone or an ether. For example, the alcohol is selected from the group consisting of methanol, ethanol, isopropanol, n-butanol, sec-butanol and neopentanol.

In an additional variant of the method, the temperature T of the autoclave is between 50° C. and 250° C. In this case, the temperature T is selected such that it is at most 10° C. below the boiling point of the solvent used or at most 100° C. above the boiling point of the solvent used.

The object is further achieved by compounds in accordance with the general formula [Ru(arene)X$_2$]$_2$ (C), obtainable according to an embodiment of the method described above, wherein arene is selected from the group consisting of mononuclear and polynuclear arenes and mononuclear and polynuclear heteroarenes and X=halogen. These μ-Cl-bridged ruthenium(II) complexes are stable and therefore easy to store. They are suitable, for example, as educts for the synthesis of halide-free ruthenium(0) complexes.

In one embodiment of the compounds in accordance with the general formula [Ru(arene)X$_2$]$_2$ (C), obtainable according to an embodiment of the method described above, it is provided that arene is selected from the group consisting of benzene, toluene, ethylbenzene, tert-butylbenzene, sec-butylbenzene, propylbenzene, isopropylbenzene, benzocyclopentane, 4-ethyl-toluene, ortho-xylene, meta-xylene, para-xylene, chlorobenzene, mesitylene, para-cymene and anisole.

Furthermore, the object is achieved by the use of a compound in accordance with the general formula [Ru(arene)X$_2$]$_2$(C), obtained or obtainable according to an embodiment of the method described above, as a precursor for the production of a ruthenium(0) compound. The use is, for example, a method for producing a compound in accordance with the general formula [Ru(arene)(R$^a$—N=CR$^1$—CR$^3$=N—R$^b$)] (A) or [Ru(arene)((R$^c$,R$^d$)N—N=CR$^{H1}$—CR$^{H3}$=N—N(R$^e$,R$^f$))] (B) using a compound in accordance with the general formula [Ru(arene)X$_2$]$_2$ (C), obtained or obtainable according to an embodiment of the method described above, comprising the following steps:
a) providing a compound
   in accordance with the general formula [Ru(arene)X$_2$]$_2$ (C),
   wherein
      arene is selected from the group consisting of mononuclear and polynuclear arenes and mononuclear and polynuclear heteroarenes, and
      X=halogen,
and
b) producing a compound in accordance with the general formula

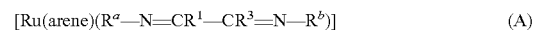
[Ru(arene)(R$^a$—N=CR$^1$—CR$^3$=N—R$^b$)]  (A)

or

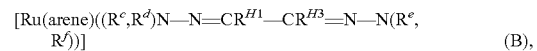
[Ru(arene)((R$^c$,R$^d$)N—N=CR$^{H1}$—CR$^{H3}$=N—N(R$^e$,R$^f$))]  (B), wherein
   arene is selected from the group consisting of mononuclear and polynuclear arenes and mononuclear and polynuclear heteroarenes
and
   R$^1$, R$^3$, R$^{H1}$, R$^{H3}$, R$^a$, R$^b$, R$^c$, R$^d$, R$^e$, and R$^f$ are independently selected from the group consisting of H, an alkyl radical (C1-C10) and an aryl radical, using a compound in accordance with the general formula [Ru(arene)X$_2$]$_2$ (C), obtained or obtainable according to an embodiment of the method described above.

This is particularly advantageous because type C compounds can be produced simply, inexpensively and with comparatively better yield using the method described above. This allows their use on an industrial scale.

The object is further achieved by a method for producing a compound in accordance with the general formula [Ru(arene)((R$^c$,R$^d$)N—N=CR$^{H1}$—CR$^{H3}$=N—N(R$^e$,R$^f$))] (B),
wherein
i) arene is selected from the group consisting of mononuclear and polynuclear arenes and mononuclear and polynuclear heteroarenes
and
ii) R$^{H1}$, R$^{H3}$, R$^c$, R$^d$, R$^e$ and R$^f$ are independently selected from the group consisting of H, an alkyl radical (C1-C10) and an aryl radical,
comprising the following steps:
a) providing a compound
   in accordance with the general formula [Ru(arene)X$_2$]$_2$ (C), wherein
      X=halogen and
      arene is selected from the group consisting of mononuclear and polynuclear arenes and mononuclear and polynuclear heteroarenes, b) reacting [Ru(arene)X$_2$]$_2$ with M$^A_2$CO$_3$ or M$^E$CO$_3$,
   wherein M$^A$=alkali metal and M$^B$=alkaline earth metal,
   and
   a ligand in accordance with the general formula (R$^c$,R$^d$)N—N=CR$^{H1}$—CR$^{H3}$=N—N(R$^e$, R$^f$) in a polar solvent.

The solvent may also be a mixture of solvents.

The method claimed advantageously permits the preparation of the target compounds in accordance with the general formula [Ru(arene)((R$^c$,R$^d$)N—N=CR$^{H1}$—CR$^{H3}$=N—N(R$^e$,R$^f$))] (B) in a two-step process. Depending on the target compound, the educts used are the simple and inexpensively preparable compound [Ru(arene)X$_2$]$_2$ and the simply and inexpensively accessible diazadiene (R$^c$,R$^d$)N—N=CR$^{H1}$—CR$^{H3}$=N—N(R$^e$,R$^f$). The reducing agent used is an alkali metal carbonate or an alkaline earth metal carbonate. These salts are relatively inexpensive and their use does not require any special safety measures. Thus, against this background, the method claimed can also be carried out on an industrial scale without additional effort. The ruthenium(0) complexes in accordance with the general formula B are obtained using the method claimed with good yields and a high degree of purity, which is particularly advantageous with regard to the industrial use of these compounds.

As a whole, the method claimed overcomes the disadvantages of the prior art. In particular, ruthenium(0) complexes which have a comparatively low melting points and which are therefore particularly suitable for use as ruthenium(0) precursors in vapor deposition processes or atomic layer deposition processes can be prepared using the method. The method is characterized by a particularly simple and cost-effective process control, because it comprises a two-step process that can be carried out without special effort in terms of preparation, i.e. using standard methods, and is based on simply and comparatively inexpensively accessible educts. Purification involves only simple steps, such as filtration or sublimation at comparatively low temperatures. The desired ruthenium(0) compounds in accordance with the general formula B, such as [Ru(anisole)((CH$_3$)$_2$N—N=CH—CH=N—N(CH$_3$)$_2$)], are therefore obtained in a reproducible manner with a high degree of purity. In particular, the purity of the preparable ruthenium(II) complexes fulfills the requirements for ruthenium(0) precursors for the production of ruthenium layers and layers containing ruthenium. The yields are good and reproducible. In addition, the method can also be carried out on an industrial scale, wherein comparable yields and purity of the target compounds are achieved. The method claimed saves time and costs in comparison.

In one embodiment of the method, [Ru(arene)X$_2$]$_2$ and M$^A_2$CO$_3$ or M$^E$CO$_3$ are provided in step b), and a solvent and a ligand in accordance with the general formula (R$^c$,R$^d$)N—N=CR$^{H1}$—CR$^{H3}$=N—N(R$^e$,R$^f$) are then added.

In an additional embodiment of the method, M$^A_2$CO$_3$, wherein M$^A$=Li, Na or K, or M$^E$CO$_3$, wherein M$^E$=Mg, Ca, Sr or Ba, is used. These reducing agents are commercially available in large quantities and at relatively low cost. In addition, they can be classified as comparatively harmless reducing agents from a safety perspective.

In an additional variant of the method, the molar ratio [Ru(arene)X$_2$]$_2$:M$^A_2$CO$_3$ or [Ru(arene)X$_2$]$_2$:M$^E$CO$_3$ is between 1:2 and 1:10. In an additional embodiment, a molar ratio between 1:2.1 and 1:8 is selected.

In an additional embodiment of the method, the molar ratio [Ru(arene)X$_2$]$_2$:(R$^c$,R$^d$)N—N=CR$^{H1}$—CR$^{H3}$=N—N(R$^e$,R$^f$) is between 1:2 and 1:10. In an additional variant of the method, the molar ratio is between 1:2.1 and 1:6.

In an additional embodiment of the method, the solvent is an alcohol, an ether, acetonitrile or acetone. In an additional embodiment, the solvent is methanol, ethanol, isopropanol, n-butanol, sec-butanol, neo-pentanol, tetrahydrofuran, dimethyl ether, diethyl ether, methyl tert-butyl ether, 1,4-dioxane, acetonitrile or acetone.

In an additional embodiment of the method, the reaction mixture from step b) is heated, wherein a temperature T$_1$ of the reaction mixture is between 20° C. and 160° C. An additional variant of the method provides that the reaction mixture comprising [Ru(arene)X$_2$]$_2$, an alkali metal or alkaline earth metal carbonate, a solvent and a ligand in accordance with the general formula (R$^c$,R$^d$)N—N=CR$^{H1}$—CR$^{H3}$=N—N(R$^e$,R$^f$) is heated under reflux conditions. In this case, the reaction time at this temperature T1 depends on the composition of the reaction mixture. In isopropanol, the method is carried out in many cases under reflux conditions for eight to 16 hours.

In an additional variant of the method, step b) is followed by step c), which comprises isolating [Ru(arene)((R$^c$,R$^d$)N—N=CR$^{H1}$—CR$^{H3}$=N—N(R$^e$,R$^f$))] (B). The isolation may include one or more method steps, such as the reduction (that is, concentration) of the solvent volume, e.g. by means of "bulb-to-bulb," the addition of a solvent and/or a solvent exchange to remove impurities and/or educts, a distillation, sublimation, washing and/or drying of the product. Several filtration steps can also be provided, if necessary one or more filtrations over a cleaning medium, e.g. activated carbon or silica, e.g. Celite®. A further reaction of the target compounds in accordance with the general formula B in situ, i.e. without prior isolation, is also possible.

The object is also achieved by compounds in accordance with the general formula [Ru(arene)((R$^c$,R$^d$)N—N=CR$^{H1}$—CR$^{H3}$=N—N(R$^e$,R$^f$))] (B),
wherein
 i) arene is selected from the group consisting of mononuclear and polynuclear arenes and mononuclear and polynuclear heteroarenes
and
 ii) R$^{H1}$, R$^{H3}$, R$^c$, R$^d$, R$^e$ and R$^f$ are independently selected from the group consisting of H, an alkyl radical (C1-C10) and an aryl radical,
obtainable according to an embodiment of the method described above.

In this case, the general formula B includes both the monomers and any oligomers.

The alkyl and/or aryl radicals R$^{H1}$, R$^{H3}$ and R$^c$-R$^f$ may be substituted, for example partially fluorinated or perfluorinated. The mononuclear and polynuclear arenes and the mononuclear and polynuclear heteroarenes may also be substituted, for example by one or more alkoxy radicals.

Examples of the alkyl and aryl radicals R$^{H1}$, R$^{H3}$ and R$^c$-R$^f$ are CH$_3$, C$_2$H$_5$, nPr, iPr, nBu, tBu, sBu, iBu, CH$_2$sBu, CH$_2$iBu, CH(CH$_3$)(iPr), CH(CH$_3$)(nPr), CH(C$_2$H$_5$)$_2$, C(CH$_3$)$_2$(C$_2$H$_5$), C$_6$H$_{11}$ and C$_6$H$_5$.

The compounds claimed of the type [Ru(arene)((R$^c$,R$^d$)N—N=CR$^{H1}$—CR$^{H3}$=N—N(R$^e$,R$^f$))] (B), obtainable according to an embodiment of the method described above, can be prepared in a reproducible manner with good yields and with a high degree of purity. Thus, they are suitable as ruthenium(0) precursors for the deposition of ruthenium layers or layers containing ruthenium on a surface of a substrate, even on an industrial scale. The ruthenium(0) complexes can be prepared starting from ruthenium(II) precursors of the type [Ru(arene)X$_2$]$_2$ in a simple two-step synthesis and can be purified easily, e.g. by distillation or sublimation at relatively low temperatures. This is particularly advantageous because they can be synthesized and purified using simple standard methods, i.e. without great effort in terms of preparation. Thus, the ruthenium(0) complexes claimed can be prepared not only simply but also comparatively inexpensively. Based on the range of variation of the substitution patterns of the arene ligands and the DAD ligands ($R^c,R^d$)N—N=$CR^{H1}$—$CR^{H3}$=N—N($R^e,R^f$) (bis(hydrazone)glyoxal), tailor-made ruthenium(0) precursors can be provided for various applications. Thus, a portfolio of ruthenium(0) complexes is provided, from which a suitable compound can be selected, namely according to the requirements of the respective deposition process in terms of the volatility and thermal degradation of the ruthenium(0) precursor. Some complexes of the general formula B have comparatively lower melting points due to the presence of a hydrazone unit and consequently a comparatively more labile N—N single bond instead of an N—C single bond, as in the case of compounds of the known type [Ru(arene)($R^a$—N=$CR^1$—$CR^3$=N—$R^b$)] (A). This makes them even more suitable for use as ruthenium(0) precursors in a vapor deposition process. For example, the compound [Ru(anisole)(iPr—N=CH—CH=N-iPr)] of type A has a melting point at 95.4° C., while the complex [Ru(anisole)($Me_2$N—N=CH—CH=N—$NMe_2$)] of type B already melts at 70.2° C. Thus, these two compounds also differ in terms of their thermal degradation.

In one embodiment of the compounds obtainable according to an embodiment of the method described above, arene is selected from the group consisting of benzene, toluene, ethylbenzene, tert-butylbenzene, sec-butylbenzene, propylbenzene, isopropylbenzene, benzocyclopentane, 4-ethyltoluene, ortho-xylene, meta-xylene, para-xylene, chlorobenzene, mesitylene, para-cymene, anisole, pyridine, pyridine derivatives, diazines, diazine derivatives, triazines and triazine derivatives.

The object is further achieved by a method for producing a compound
  in accordance with the general formula [Ru(arene)($R^a$—N=$CR^1$—$CR^3$=N—$R^b$)] (A), wherein
  i) arene is selected from the group consisting of mononuclear and polynuclear arenes and mononuclear and polynuclear heteroarenes
  and
  ii) $R^1$, $R^3$, $R^a$ and $R^b$ are independently selected from the group consisting of H, an alkyl radical (C1-C10) and an aryl radical
  or
  in accordance with the general formula [Ru(arene)(($R^c$, $R^d$)N—N=$CR^{H1}$—$CR^{H3}$=N—N($R^e,R^f$))] (B), wherein
  i) arene is selected from the group consisting of mononuclear and polynuclear arenes and mononuclear and polynuclear heteroarenes and
  ii) $R^{H1}$, $R^{H3}$, $R^c$, $R^d$, $R^e$ and $R^f$ are independently selected from the group consisting of H, an alkyl radical (C1-C10) and an aryl radical, comprising the following steps:
a) providing a compound
  in accordance with the general formula [Ru(arene)$X_2]_2$ (C), wherein
  X=halogen and
  arene is selected from the group consisting of mononuclear and polynuclear arenes and mononuclear and polynuclear heteroarenes, b) reacting [Ru(arene)$X_2]_2$ with zinc and a ligand in accordance with the general formula $R^a$—N=$CR^1$—$CR^3$=N—$R^b$ or ($R^c,R^d$)N—N=$CR^{H1}$—$CR^{H3}$=N—N($R^e,R^f$) in an aprotic solvent.

The solvent may also be a mixture of solvents.

The method claimed advantageously permits the preparation of the target compounds in accordance with the general formula [Ru(arene)($R^a$—N=$CR^1$—$CR^3$=N—$R^b$)] (A) or in accordance with the general formula [Ru(arene)(($R^c,R^d$)N—N=$CR^{H1}$—$CR^{H3}$=N—N($R^e,R^f$))] (B) in a two-step process. Depending on the target compound, the educts used are the simply and inexpensively preparable compounds [Ru(arene)$X_2]_2$ and the simply and inexpensively accessible diazadiene $R^a$—N=$CR^1$—$CR^3$=N—$R^b$ or ($R^c,R^d$)N—N=$CR^{H1}$—$CR^{H3}$=N—N($R^e,R^f$)). Elemental zinc serves as the reducing agent. This is particularly advantageous because zinc is comparatively inexpensive on the one hand and the use of zinc does not require any special safety measures on the other hand. Thus, against this background, the method claimed can also be carried out on an industrial scale without additional effort. In addition, any excess elemental zinc can be separated by means of simple filtration so that the target compound does not contain any metallic impurities that alter or deteriorate its properties in an uncontrollable and sometimes irreversible manner. In addition, the ruthenium(0) complexes in accordance with the general formulas A and B are obtained by the method claimed with good yields and a high degree of purity, which is particularly advantageous with regard to the industrial use of these compounds.

It has been found that, for example, in the case of the syntheses of [Ru(p-cymene)(iPr-N=CH—CH=N-iPr)] (type A) and [Ru(p-cymene)(($CH_3)_2$N—N=CH—CH=N—N($CH_3)_2$)] (type B), a by-product that is difficult to separate is produced when $K_2CO_3$ is used as the reducing agent in iPrOH and the reaction mixture is heated for 16 hours under reflux conditions. In contrast, the production of such compounds in their pure form is comparatively simple with the method claimed here, in which zinc acts as the reducing agent.

Alternatively, another reducing agent, such as potassium graphite ($KC_8$), can be used as the reducing agent.

As a whole, the method claimed overcomes the disadvantages of the prior art. In particular, no salt loads, such as LiCl, NaCl or KCl, which are difficult to separate depending on the solvent, are produced. The method is characterized by a particularly simple and cost-effective process control, because it comprises a two-step process that can be carried out under comparatively mild reaction conditions and is based on simply and comparatively inexpensively accessible educts. In addition, few method steps that are easily accomplished in terms of preparation are necessary. Only by-products that can be separated quantitatively in a simple manner are produced. The desired ruthenium(0) compound in accordance with the general formula A or B is therefore obtained in a reproducible manner with a high degree of purity by means of standard purification methods. In particular, the purity of the preparable ruthenium(II) complexes fulfills the requirements for ruthenium(0) precursors for the production of ruthenium layers and layers containing ruthenium. The yields are good and reproducible. In addition, the method can also be carried out on an industrial scale, wherein comparable yields and purity of the target compounds are achieved. The method claimed saves time, energy and costs in comparison. As a whole, it can be classified as satisfactory from an (atom-)economic and ecological perspective.

In one embodiment of the method, [Ru(arene)X$_2$]$_2$ and zinc are provided in step b) and a solvent and a ligand in accordance with the general formula R$^a$—N=CR$^1$—CR$^3$=N—R$^b$ or (R$^c$,R$^d$)N—N=CR$^{H1}$—CR$^{H3}$=N—N(R$^e$, R$^f$) are then added.

In an additional embodiment of the method, zinc is added in the form of powder and/or in the form of zinc granules. Zinc is comparatively inexpensive and can be classified as a comparatively harmless reducing agent from a safety perspective. The separation of any excess zinc is advantageously possible by means of simple filtration, e.g. by means of Celite®. Separation is particularly simple in the case of zinc granules, namely independently of their grain size.

In an additional variant of the method, the molar ratio [Ru(arene)X$_2$]$_2$:Zn is between 1:2 and 1:10. In an additional variant of the method, a ratio between 1:2.1 and 1:6 is selected.

In an additional embodiment of the method, the molar ratio [Ru(arene)X$_2$]$_2$:R$^a$—N=CR$^1$—CR$^3$=N—R$^b$ or [Ru(arene)X$_2$]$_2$:(R$^c$,R$^d$)N—N=CR$^{H1}$—CR$^{H3}$=N—N(R$^e$,R$^f$) is between 1:2 and 1:10. In an additional variant of the method, a ratio between 1:2.1 and 1:6 is selected. Since the Zn$^{2+}$ cation of the zinc(II) chloride resulting as a by-product is probably also complexed by the DAD ligands, it may be necessary depending on the choice of the other reaction conditions to select a nonstoichiometric molar ratio [Ru(arene)X$_2$]$_2$:R$^a$—N=CR$^1$—CR$^3$=N—R$^b$ or [Ru(arene)X$_2$]$_2$:(R$^c$,R$^d$)N—N=CR$^{H1}$—CR$^{H3}$=N—N(R$^e$, R$^f$). The DAD ligands dissolve in common organic solvents so that any excess can be removed quickly and easily.

An additional variant of the method provides that the solvent is an ether, a benzene derivative, acetonitrile or acetone. In an additional embodiment, the solvent is tetrahydrofuran, dimethyl ether, diethyl ether, methyl tert-butyl ether, 1,4-dioxane, toluene, xylene, acetonitrile or acetone. The solvent can also be a mixture of solvents in each case.

In an additional embodiment of the method, the reaction mixture from step (b) is heated, wherein a temperature T$_2$ of the reaction mixture is between 20° C. and 140° C. An additional variant of the method provides that the reaction mixture comprising [Ru(arene)X$_2$]$_2$, zinc, a solvent and a ligand in accordance with the general formula R$^a$—N=CR$^1$—CR$^3$=N—R$^b$ or (R$^c$,R$^d$)N—N=CR$^{H1}$—CR$^{H3}$=N—N(R$^e$,R$^f$) is heated to a temperature T$_R$. In doing so, the temperature T$_R$ is selected such that it is at most 10° C. below a boiling point of the solvent or at most 50° C. above the boiling point of the solvent. In tetrahydrofuran, the method is carried out in many cases at 60° C. for five hours. The reaction time at the temperature T$_2$ or at the temperature T$_R$ depends on the composition of the respective reaction mixture.

An additional variant of the method provides that step b) is followed by step c), which comprises isolating [Ru(arene)(R$^a$—N=CR$^1$—CR$^3$=N—R$^b$)] (A) or [Ru(arene)((R$^c$,R$^d$)N—N=CR$^{H1}$—CR$^{H3}$=N—N(R$^e$,R$^f$))] (B). The isolation may include one or more method steps, such as the reduction (that is, concentration) of the solvent volume, e.g. by means of "bulb-to-bulb," the addition of a solvent and/or a solvent exchange to remove impurities and/or educts, a distillation, sublimation, washing and/or drying of the product. Several filtration steps can also be provided, if necessary one or more filtrations over a cleaning medium, e.g. activated carbon or silica, e.g. Celite®. A further reaction of the target compounds in accordance with the general formula A or B in situ, i.e. without prior isolation, is also possible.

The object is also achieved by compounds in accordance with the general formula

[Ru(arene)(R$^a$—N=CR$^1$—CR$^3$=N—R$^b$)] (A), wherein
i) arene is selected from the group consisting of mononuclear and polynuclear arenes and mononuclear and polynuclear heteroarenes
and
ii) R$^1$, R$^3$, R$^a$ and R$^b$ are independently selected from the group consisting of H, an alkyl radical (C1-C10) and an aryl radical or

[Ru(arene)((R$^c$,R$^d$)N—N=CR$^{H1}$—CR$^{H3}$=N—N(R$^e$, R$^f$))] (B), wherein
i) arene is selected from the group consisting of mononuclear and polynuclear arenes and mononuclear and polynuclear heteroarenes
and
ii) R$^{H1}$, R$^{H3}$, R$^c$, R$^d$, R$^e$ and R$^f$ are independently selected from the group consisting of H, an alkyl radical (C1-C10) and an aryl radical, obtainable according to an embodiment of the method described above.

The general formulas A and B include both the monomers and any oligomers.

The alkyl and/or aryl radicals R$^1$, R$^3$, R$^{H1}$, R$^{H3}$ and R$^a$-R$^f$ may be substituted, for example partially fluorinated or perfluorinated. The mononuclear and polynuclear arenes and the mononuclear and polynuclear heteroarenes may also be substituted, for examples by one or more alkoxy radicals.

Examples of the alkyl and aryl radicals R$^1$, R$^3$, R$^{H1}$, R$^{H3}$ and R$^a$-R$^f$ are CH$_3$, C$_2$H$_5$, nPr, iPr, nBu, tBu, sBu, iBu, CH$_2$sBu, CH$_2$iBu, CH(CH$_3$)(iPr), CH(CH$_3$)(nPr), CH(C$_2$H$_5$)$_2$, C(CH$_3$)$_2$(C$_2$H$_5$), C$_6$H$_{11}$ and C$_6$H$_5$.

The compounds claimed of the type [(Ru(arene)(R$^a$—N=CR$^1$—CR$^3$=N—R$^b$)] (A) and of the type [Ru(arene)((R$^c$,R$^d$)N—N=CR$^{H1}$—CR$^{H3}$=N—N(R$^e$,R$^f$))] (B), obtainable according to an embodiment of the method described above, can be prepared in a reproducible manner with good yields and with a high degree of purity. Thus, they are suitable as ruthenium(0) precursors for the deposition of ruthenium layers or layers containing ruthenium on a surface of a substrate, even on an industrial scale. The ruthenium(0) complexes can be prepared starting from ruthenium(II) precursors of the type [Ru(arene)X$_2$]$_2$ in a simple two-step synthesis, wherein the by-products produced can be quantitatively separated off in a simple manner. It is particularly advantageous that both their synthesis and their purification can be carried out using simple standard methods, i.e. without great effort in terms of preparation. Thus, the ruthenium(0) complexes claimed can be prepared not only simply but also comparatively inexpensively. Based on the range of variation of the substitution patterns of the arene ligands and the two DAD ligands R$^a$—N=CR$^1$—CR$^3$=N—R$^b$ (glyoxal-bis(imine)) and (R$^c$,R$^d$)N—N=CR$^{H1}$—CR$^{H3}$=N—N(R$^e$,R$^f$) (glyoxal-bis(hydrazone)), tailor-made ruthenium(0) precursors can be provided for various applications. Thus, a portfolio of ruthenium(0) complexes is provided, from which a suitable compound can be selected, namely according to the requirements of the respective deposition process in terms of the volatility and thermal degradation of the ruthenium(0) precursor. Due to the presence of a hydrazone unit and consequently a comparatively more labile N—N single bond instead of an N—C single bond as in the case of type A compounds, the complexes of the general formula B have properties different from those of the analogous compounds in accordance with the general formula A. Thus, some representatives of the compound class in accordance with the general formula B have comparatively lower melting points. This makes them even more suitable for use as ruthenium(0) precursors in a vapor deposition process. For example, the compound [Ru(benzene)(iPr—N=CH—CH=N-iPr)] of type A has a melting point at 106.7° C., while the complex [Ru(benzene)(Me$_2$N—N=CH—CH=N—NMe$_2$)] of type B already melts at 86.5° C. Thus, these two compounds also differ in terms of their thermal degradation.

In one embodiment of the compounds in accordance with the general formula [Ru(arene)(R$^a$—N=CR$^1$—CR$^3$=N—R$^b$)] (A) or [Ru(arene)((R$^c$,R$^d$)N—N=CR$^{H1}$—CR$^{H3}$=N—N(R$^e$,R$^f$))] (B), obtainable according to an embodiment of the method described above, it is provided that arene is selected from the group consisting of benzene, toluene, ethylbenzene, tert-butylbenzene, sec-butylbenzene, propylbenzene, isopropylbenzene, benzocyclopentane, 4-ethyltoluene, ortho-xylene, meta-xylene, para-xylene, chlorobenzene, mesitylene, para-cymene, anisole, aniline, pyridine, pyridine derivatives, diazines, diazine derivatives, triazines and triazine derivatives.

Furthermore, the object is achieved by using an embodiment of the compounds described above in accordance with the general formula [Ru(arene)(R$^a$—N=CR$^1$—CR$^3$=N—R$^b$)] (A) or [Ru(arene)((R$^c$,R$^d$)N—N=CR$^{H1}$—CR$^{H3}$=N—N(R$^e$,R$^f$))] (B) or a compound in accordance with the general formula [Ru(arene)(R$^a$—N=CR$^1$—CR$^3$=N—R$^b$)] (A) or [Ru(arene)((R$^c$,R$^d$)N—N=CR$^{H1}$—CR$^{H3}$=N—N(R$^e$,R$^f$))] (B), obtained or obtainable according to an embodiment of one of the methods described above, for depositing a ruthenium layer or a layer containing ruthenium on a surface of a substrate. In one variant of the application, it is provided that the deposition is carried out by means of a vapor deposition process or by means of an atomic layer deposition process. The aforementioned use of a compound in accordance with the general formula [Ru(arene)(R$^a$—N=CR$^1$—CR$^3$=N—R$^b$)] (A) or [Ru(arene)((R$^c$,R$^d$)N—N=CR$^{H1}$—CR$^{H3}$=N—N(R$^e$,R$^f$))] (B) is a method for producing a substrate having on a surface thereof a ruthenium layer or a layer containing ruthenium, comprising the following steps:

a) providing a compound in accordance with the general formula
[Ru(arene)(R$^a$—N=CR$^1$—CR$^3$=N—R$^b$)] (A), wherein
  i) arene is selected from the group consisting of mononuclear and polynuclear arenes and mononuclear and polynuclear heteroarenes
  and
  ii) R$^1$, R$^3$, R$^a$ and R$^b$ are independently selected from the group consisting of H, an alkyl radical (C1-C10) and an aryl radical
    according to an embodiment of the compounds described above in accordance with
    the general formula A
  or
    obtained or obtainable according to an embodiment of the method described above
  or
  [Ru(arene)((R$^c$,R$^d$)N—N=CR$^{H1}$—CR$^{H3}$=N—N(R$^e$,R$^f$))] (B), wherein
  i) arene is selected from the group consisting of mononuclear and polynuclear arenes and mononuclear and polynuclear heteroarenes
  and
  ii) R$^{H1}$, R$^{H3}$, R$^c$, R$^d$, R$^e$ and R$^f$ are independently selected from the group consisting of H, an alkyl radical (C1-C10) and an aryl radical,
    according to an embodiment of the compounds described above in accordance with
    the general formula B
  or
    obtained or obtainable according to an embodiment of one of the methods described above, b) depositing a ruthenium layer or a layer containing ruthenium on a surface of the substrate using a compound in accordance with the general formula $$[Ru(arene)(R^a—N=CR^1—CR^3=N—R^b)] \quad (A)$$

or $$[Ru(arene)((R^c,R^d)N—N=CR^{H1}—CR^{H3}=N—N(R^e,R^f))] \quad (B).$$

The term "layer" is synonymous with the expression "film" and does not make any statement regarding the layer thickness or the film thickness. Corundum foils or thin metallic foils can, for example, be used as the substrate. The substrate itself can be part of a component.

In one embodiment of the method, the ruthenium layer or the layer containing ruthenium is deposited by a vapor deposition process or by an atomic layer deposition process. Alternatively, a sol-gel process can be used, wherein the sol is deposited on the substrate by means of spin coating or dip coating, for example. The ruthenium(0) complexes of the general formulas A and B are particularly suitable as ruthenium(0) precursors due to their high degree of purity. In addition, they are particularly simple and comparatively inexpensive to prepare, which enables their use on an industrial scale.

In one embodiment of the use of a compound in accordance with the general formula A or B or the method for producing a substrate having on a surface thereof a ruthenium layer or a layer containing ruthenium, the substrate is a wafer. The wafer may comprise silicon, silicon carbide, germanium, gallium arsenide, indium phosphide, a glass, such as SiO$_2$, and/or a plastic, such as silicone, or consist entirely of one or more such materials. The wafer can also have one or more wafer layers, each having one surface. The deposition of the ruthenium layer or the layer containing ruthenium may be provided on the surface of one or more wafer layers. When using a compound of the general formula A or B, elemental ruthenium layers or layers containing ruthenium with a high degree of purity are obtained with comparatively low amount of material.

The object is further achieved by a substrate that has a ruthenium layer or a layer containing ruthenium on one surface. In this case, the ruthenium layer or the layer containing ruthenium can be produced using an embodiment of the compounds described above in accordance with the general formula [Ru(arene)(R$^a$—N=CR$^1$—CR$^3$=N—R$^b$)] (A) or [Ru(arene)((R$^c$,R$^d$)N—N=CR$^{H1}$—CR$^{H3}$=N—N(R$^e$,R$^f$))] (B) or a compound in accordance with the general formula [Ru(arene)(R$^a$—N=CR$^1$—CR$^3$=N—R$^b$)] (A) or [Ru(arene)((R$^c$,R$^d$)N—N=CR$^{H1}$—CR$^{H3}$=N—N(R$^e$,R$^f$))] (B), obtained or obtainable according to an embodiment of one of the methods described above.

In one embodiment, the substrate is a wafer. The wafer may comprise silicon, silicon carbide, germanium, gallium arsenide, indium phosphide, a glass, such as SiO$_2$, and/or a plastic, such as silicone, or consist entirely of one or more such materials. The wafer can also have one or more wafer layers, each having one surface. In this case, one or more surfaces may have a ruthenium layer or a layer containing ruthenium.

Furthermore, the object is achieved by using an embodiment of the compounds described above in accordance with the general formula [Ru(arene)(R$^a$—N=CR$^1$—CR$^3$=N—R$^b$)] (A) or [Ru(arene)((R$^c$,R$^d$)N—N=CR$^{H1}$—CR$^{H3}$=N—N(R$^e$,R$^f$))] (B) or a compound in accordance with the general formula [Ru(arene)(R$^a$—N=CR$^1$—CR$^3$=N—R$^b$)] (A) or [Ru(arene)((R$^c$,R$^d$)N—N=CR$^{H1}$—CR$^{H3}$=N—N(R$^e$,R$^f$))] (B), obtained or obtainable according to an embodiment of one of the methods described above, for the production of a semiconductor element or an electronic memory. Due to their high degree of purity, the ruthenium(0) complexes of the general formulas A and B are particularly suitable as ruthenium(0) precursors for the production of semiconductor elements or electronic memories. In addition, they are particularly simple and comparatively inexpensive to prepare, which enables their use on an industrial scale.

With compounds in accordance with the general formula [Ru(arene)(R$^a$—N=CR$^1$—CR$^3$=N—R$^b$)] (A) or [Ru(arene)((R$^c$,R$^d$)N—N=CR$^{H1}$—CR$^{H3}$=N—N(R$^e$,R$^f$))] (B) according to one of the above-described embodiments or compounds in accordance with the general formula [Ru(arene)(R$^a$—N=CR$^1$—CR$^3$=N—R$^b$)] (A) or [Ru(arene)((R$^c$,R$^d$)N—N=CR$^{H1}$—CR$^{H3}$=N—N(R$^e$,R$^f$))] (B), obtained or obtainable according to an embodiment of one of the methods described above, defined ruthenium(0) compounds are made available. These ruthenium(0) complexes can be prepared in a simple, inexpensive and reproducible manner with a high degree of purity and good yields in accordance with the methods claimed. In addition, the methods claimed are characterized in that they can also be carried out on an industrial scale with a comparable yield and purity of the target compounds. This is also based on the fact that the educts used can be produced simply, inexpensively and with good yields. As a whole, the methods claimed and the ruthenium(0) compounds that can thereby be prepared are to be assessed as satisfactory from an ecological and economic perspective. Due to their high degree of purity, the ruthenium(0) compounds mentioned above are particularly suitable for use as ruthenium(0) precursors for the deposition of elemental ruthenium(0) layers or layers containing ruthenium(0). In this case, the production of high-quality substrates that have such a layer on one surface requires comparatively low amount of material.

Figure 2:
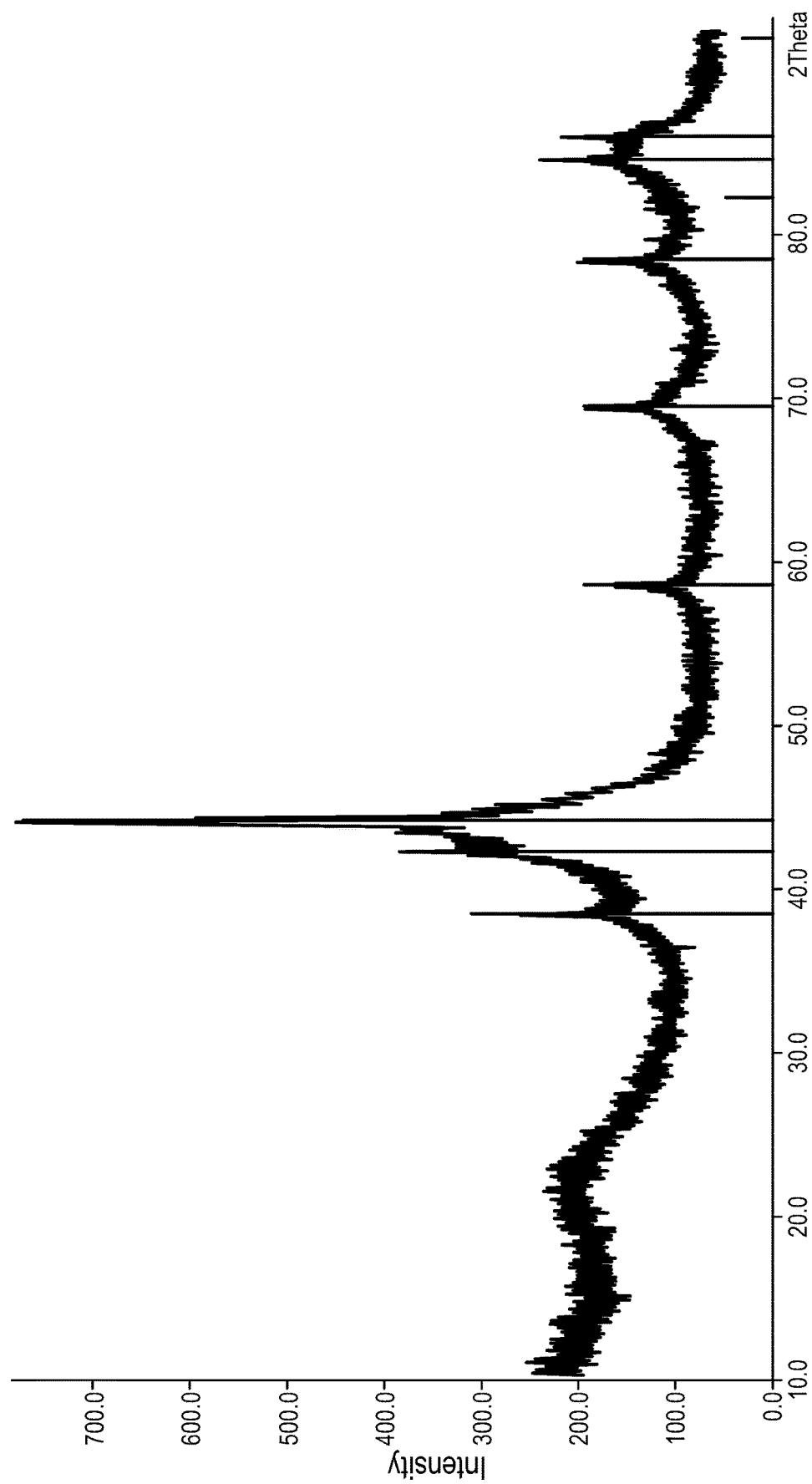
Figure 3:
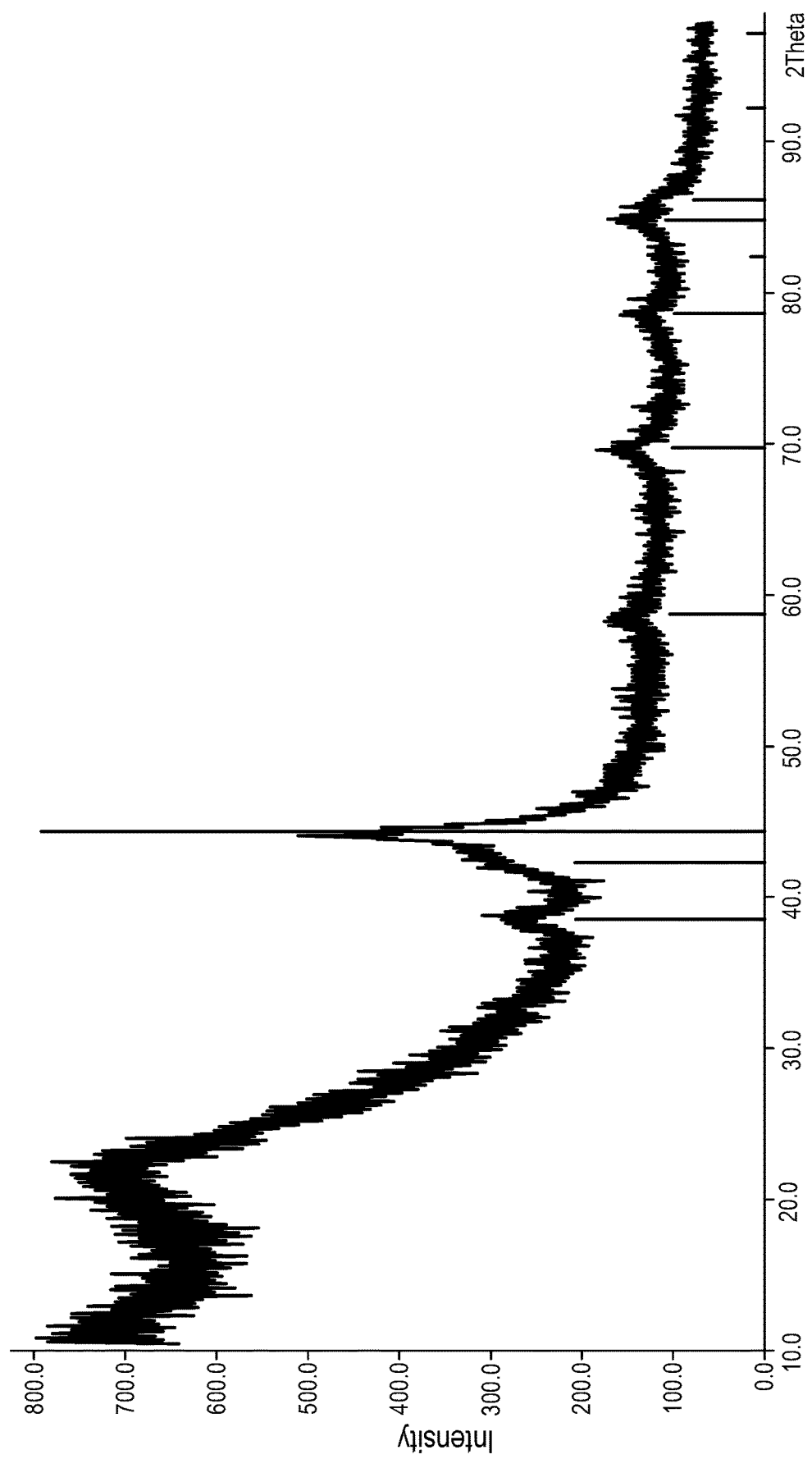
Figure 4:
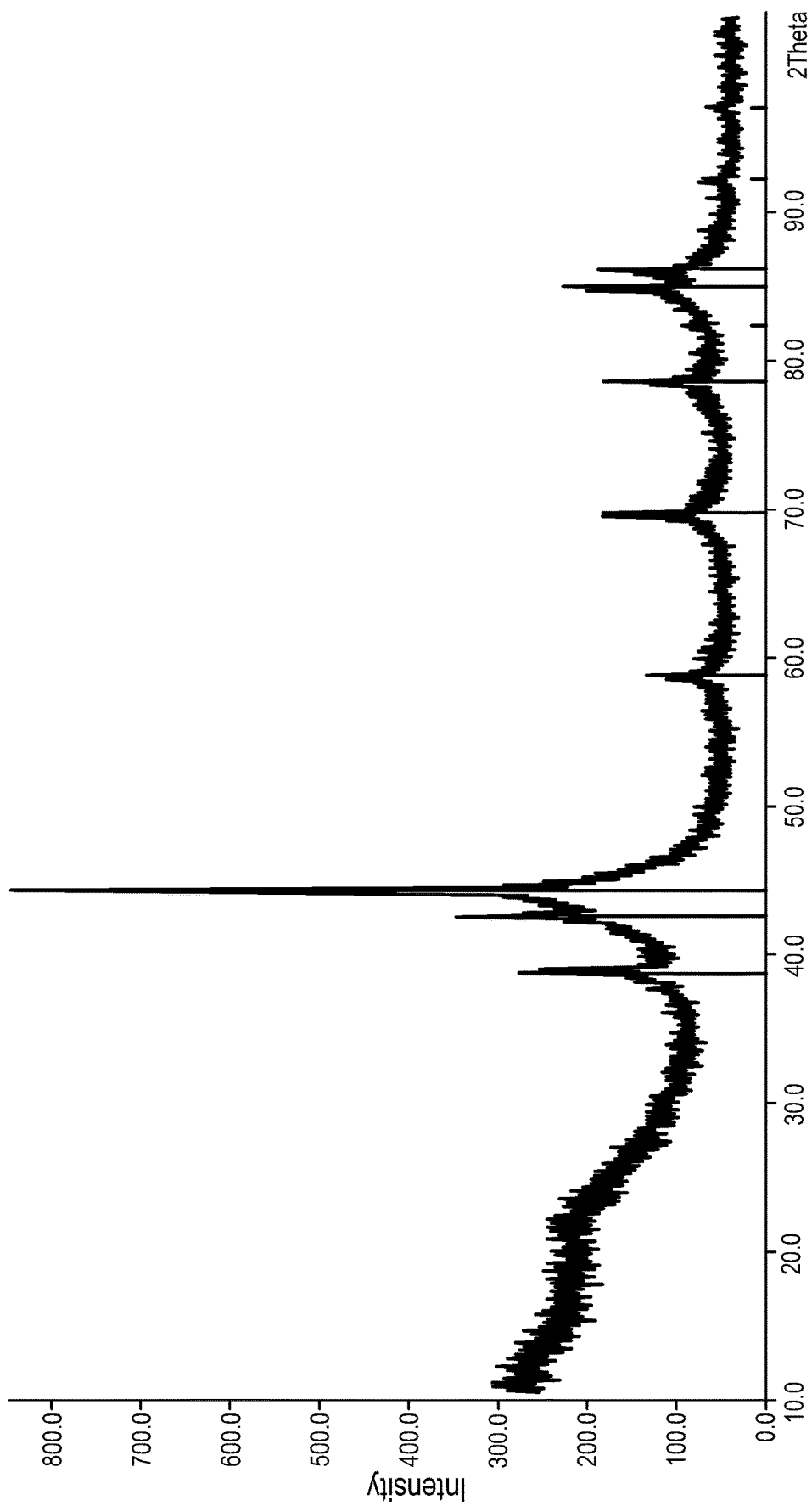

Other characteristics, details, and advantages of the invention follow from the wording of the claims as well as from the following description of the embodiment examples based upon the illustrations. The following are shown:

FIG. 1 an XRPD of the residue from a TGA of [Ru(anisole)($^{iPr}$DAD)], produced according to exemplary embodiment 2, FIG. 2 an XRPD of the residue from a TGA of [Ru(anisole)($^{Me2N}$DAD)], produced according to exemplary embodiment 3, FIG. 3 an XRPD of the residue from a TGA of [Ru(benzene)($^{Me2N}$DAD)], produced according to exemplary embodiment 5 and FIG. 4 an XRPD of the residue of one of the TGAs of [Ru(p-cymene)($^{Me2N}$DAD)], produced according to exemplary embodiment 9.

The X-ray powder diffractograms (XRPDs, green) shown in FIG. 1 to FIG. 4 were recorded from residues of compounds [Ru(anisole)($^{iPr}$DAD)] (FIG. 1), [Ru(anisole)($^{NMe2}$DAD)] (FIG. 2), [Ru(benzene)($^{NMe2}$DAD)] (FIG. 3) and [Ru(p-cymene)($^{NMe2}$DAD)] (FIG. 4), which were available according to the respective thermogravimetric analysis (TGA) that was previously carried out. The respective reflex position documented in the literature of elemental ruthenium is shown in red (see M. Cernohorsky, Acta Cryst. 1960, 13, 823-826). On the x-axis, the 2Θ values are plotted in °; on the y-axis, the reflex intensity is respectively plotted in arbitrary units.

Both for the residue arising from the thermal decomposition of the type A compound, namely [Ru(anisole)($^{iPr}$DAD)] (FIG. 1), and for the respective residue arising from the thermal decomposition of the type B compound, namely [Ru(anisole)($^{NMe2}$DAD)] (FIG. 2), [Ru(benzene)($^{NMe2}$DAD)] (FIG. 3) and [Ru(p-cymene)($^{NMe2}$DAD)] (FIG. 4), the observed reflex positions are in good conformity with the reflex positions documented in the literature for elemental ruthenium. The thermal decomposition of the aforementioned compounds of types A and B to form elemental ruthenium is verified by means of TGA and subsequent X-ray powder diffractometry (XRPD) of the respective residue obtained. This shows that the compounds described above in accordance with the general formula [Ru(arene)(R$^a$—N=CR$^1$—CR$^3$=N—R$^b$)] (A) or [Ru(arene)((R$^c$,R$^d$)N—N=CR$^{H1}$—CR$^{H3}$=N—N(R$^e$,R$^f$))] (B) and a compound in accordance with the general formula [Ru(arene)(R$^a$—N=CR$^1$—CR$^3$=N—R$^b$)] (A) or [Ru(arene)((R$^c$,R$^d$)N—N=CR$^{H1}$—CR$^{H3}$=N—N(R$^e$,R$^f$))] (B), obtained or obtainable according to one of the methods described above, are suitable as ruthenium(0) precursors for the deposition of elemental ruthenium(0) layers or layers containing ruthenium(0).

Working Instructions for the Synthesis of [Ru(anisole)Cl$_2$]$_2$, [Ru(anisole)($^{Me2N}$DAD)], [Ru(anisole)($^{Me2N}$DAD)], [Ru(benzene)($^{iPr}$DAD)], [Ru(benzene)($^{Me2N}$DAD)], [Ru(mesitylene)($^{iPr}$DAD)], [Ru(mesitylene)($^{Me2N}$DAD)], [Ru(p-cymene)($^{iPr}$DAD)] and [Ru(p-cymene)($^{Me2N}$DAD)]

Materials and Methods:

All reactions were performed under a protective gas atmosphere with nitrogen or argon. The work was done with the assistance of common Schlenk techniques. The corresponding vacuum rakes or Schlenk lines were connected to rotary vane pumps made by Vacuubrand. The weighing and storage of educts, reagents and synthesized products took place in glove boxes made by MBraun (model MB 150 BG-1 or Lab Master 130) under a nitrogen atmosphere.

The solvents used were dried according to standard procedures and stored in stainless steel columns over suitable drying agents (molecular sieve, aluminum oxide, copper catalyst). The deuterated solvent C$_6$D$_6$ was dehydrated over a K/Na alloy, CDCl$_3$, over a molecular sieve 3 Å, condensed and once again stored over a molecular sieve 3 Å.

All nuclear magnetic resonance spectroscopic measurements were performed in automated mode on an AV II 300 instrument or in manual mode on an AV III HD 250, AV III HD 300 or AV III 500 instrument. $^1$H- and $^{13}$C-NMR spectra were calibrated to the corresponding residual proton signal of the solvent as an internal standard: $^1$H:C$_6$D$_6$: 7.16 ppm (s), CDCl$_3$: 7.26 ppm (s). $^{13}$C: C$_6$D$_6$: 128.0 ppm (tr), CDCl$_3$: 77.2 ppm (s). The chemical shifts are indicated in ppm and refer to the δ scale. All signals are provided with the following abbreviations according to their splitting pattern: s (singlet), d (doublet), t (triplet), hept (heptet) or sept (septet). The coupling between two nuclei A and B via n bonds is indicated by the coupling constant of the form $^n J_{AB}$ in Hertz (Hz).

In substance, the measurements of infrared spectra were usually performed on an Alpha ATR-IR spectrometer made by Bruker. The absorption bands are indicated in wave number (cm$^{-1}$), and the intensity is described with the following abbreviations: w (weak), m (medium strong), st (strong), vst (very strong). The spectra were always normalized to the band with the highest intensity.

The elemental analyses were carried out on a vario MICRO cube combustion device made by Elementar. Sample preparation was carried out in a glove box flooded with nitrogen by weighing the substance in tin crucibles, which were cold-welded and stored in a protective gas atmosphere until measurement. The elements of hydrogen, carbon and nitrogen were determined by means of a combustion analysis, wherein the information is always given in mass percent.

All EI mass spectrometric investigations were performed on an AccuTOF GCv spectrometer made by Joel. Air-sensitive and moisture-sensitive samples were prepared in a glove box in crucibles and stored in a protective gas atmosphere until measurement. In the case of high-resolution spectra, the signal with the highest intensity of the isotope pattern is respectively indicated.

The thermogravimetric investigations were performed on a TGA/DSC 3+ STAR system made by Mettler Toledo. In the process, a coupled SDTA measurement was performed for each TGA. The samples were measured in aluminum oxide, aluminum or sapphire crucibles, depending on the method or state of aggregation. The sample was heated at a specific heating rate from 25° C. to the final temperature. The evaluation of the spectra obtained was carried out with STARe software made by Mettler Toledo.

Preparation of glyoxal(bis-isopropylimine) ($^{iPr}$DAD)

The synthesis was carried out in accordance with E. A. Mistryukov, *Mendeleev Communications* 2006, 16 (5), 258-259.

$^1$H-NMR (C$_6$D$_6$, 300 MHz, 300 K): δ/ppm=7.94 (s, 2H, CH), 3.16 (hept, 2H, iPrCH), 1.08 (d, 12H, CH$_3$); $^1$H-NMR (CDCl$_3$, 300 MHz, 300 K): δ/ppm=7.87 (s, 2H, CH), 3.46 (hept, 2H, iPrCH), 1.17 (d, 12H, CH$_3$); $^{13}$C-NMR (CDCl$_3$, 75 MHz, 300 K): δ/ppm=159.8 (CH), 61.2 (iPrCH), 23.8 (CH$_3$); $^{13}$C-NM (C$_6$D$_6$, 75 MHz, 300 K): δ/ppm=159.7 (CH), 61.5 (iPrCH), 24.0 (CH$_3$).

Preparation of glyoxal(bis-dimethylaminoimine) ($^{Me2N}$DAD)

The synthesis was carried out in accordance with T. Mino, Y. Shirae, Y. Sasai, M. Sakamoto, T. Fujita, *J. Org. Chem.* 2006, 71, 6834-6839.

$^1$H-NMR (C$_6$D$_6$, 300.2 MHz): δ/ppm=7.29 (s, 2H, CHCH), 3.53 (s, 12H, NMe$_2$); $^1$H-NMR (CDCl$_3$, 300.2 MHz): δ/ppm=7.09 (s, 2H, CHCH), 2.85 (s, 12H, NMe$_2$); $^{13}$C-NMR (C$_6$D$_6$, 75.5 MHz): δ/ppm=134.8 (CHCH), 42.5 (NMe$_2$); HR-ESI(+)-MS: calculated for [M+H]$^+$=143.1291 m/z, found: 143.1295 m/z; elemental analysis: C$_6$H$_{14}$N$_4$ (142.21 g/mol), calculated: C, 50.68%; H, 9.92%; N, 39.40%, found: C, 49.96%; H, 9.72%; N, 39.86%; IR (substance) ṽ/cm$^{-1}$=2988 (w), 2952 (w), 2854 (m), 2824 (m), 2784 (m), 1668 (w), 1549 (m), 1465 (m), 1442 (m), 1420 (m), 1259 (m), 1133 (m), 1090 (w), 1009 (vs), 892 (m), 850 (w), 816 (m), 654 (w), 452 (w).

Exemplary Embodiment 1: Preparation of [Ru(Anisole)Cl$_2$]$_2$ Via an Autoclave Reaction A 250 ml glass autoclave was filled with RuCl$_3$×H$_2$O (5.0 g, ca. 18.5 mmol, 1 eq), 150 ml methanol (dehydrated) and 1-methoxy-1,4-cyclohexadiene (10 ml, 10.64 g, 96.6 mmol, 5.23 eq). The reaction mixture was stirred at 140° C. and 5 bars for 4 hours. After cooling the reaction mixture to room temperature, the precipitated product was separated by means of filtration and washed with diethyl ether. The product was obtained as an orange crystalline solid with a yield of 47%, wherein it was contaminated with 10-17% of the usual unavoidable by-product [Ru(benzene)Cl$_2$]$_2$.

$^1$H-NMR (DMSO-d$^6$, 300 MHz, 300 K): δ/ppm=6.16 (t, J=5.3 Hz, 2H), 5.53 (d, J=5.9 Hz, 2H), 5.37 (s, 1H), 3.91 (s, 3H).

Exemplary Embodiment 2: Preparation of [Ru(Anisole)($^{iPr}$DAD)]

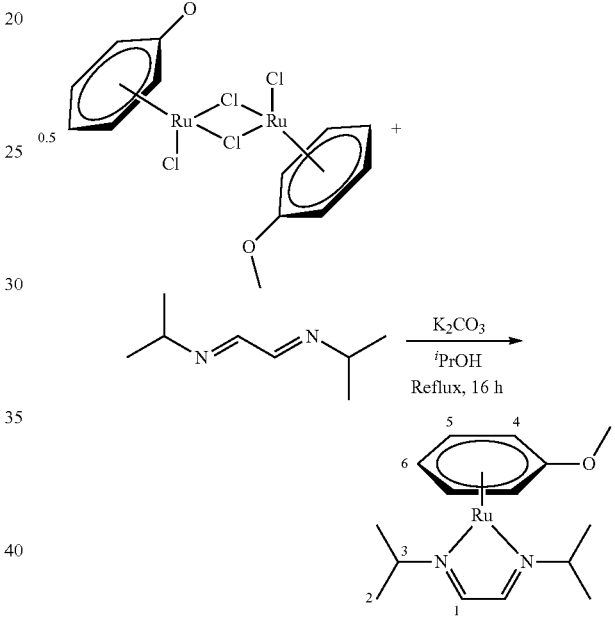

Under protective gas conditions, [RuCl$_2$(anisole)]$_2$ (96.0 mg, 0.17 mmol, 1.0 eq), bis-iso-propyl-diazadiene (48.0 mg, 0.34 mmol, 2.0 eq) and K$_2$CO$_3$ (141 mg, 1.02 mmol, 6.0 eq) were absorbed into $^i$PrOH (10 ml) and stirred for 16 hours under reflux conditions. After removing all volatile components in a vacuum, the residue was absorbed in nhexane (15 ml) and filtered by means of Celite®. In the process, the filter cake was extracted with additional amounts of nhexane (20 ml). The solvent was removed from the filtrate in a vacuum and [Ru(anisole)($^{iPr}$DAD)] was obtained as a red-orange solid (37.0 mg, 0.11 mmol, 65%).

$^1$H-NMR (C$_6$D$_6$, 300.2 MHz): δ/ppm=7.08 (s, 2H, H-1), 4.94 (d, $^3$J$_{HH}$=6.1 Hz, 2H, H-2), 4.87 (t, $^3$J$_{HH}$=5.1 Hz, 1H, H-4), 4.65 (t, $^3$J$_{HH}$=5.7 Hz, 2H, H-3), 4.47 (sept, 2H, $^i$Pr), 3.25 (s, 3H, OMe), 1.43 (d, $^3$J$_{HH}$=6.7 Hz, 12H, $^i$Pr); $^{13}$C-NMR (C$_6$D$_6$, 75.5 MHz): δ/ppm=131.1 (C-1), 100.4 (C$_q$), 74.9, 73.6, 71.9, 65.6, 62.8 ($^i$Pr), 56.5 (OMe), 25.0 ($^i$Pr). HR-EI(+)-MS: calculated for [M]$^+$=350.0932 m/z, found: 350.1124 m/z; elemental analysis: calculated for C$_{15}$H$_{24}$N$_2$ORu (349.44 g/mol): calculated (found): C, 51.56% (47.04%); H, 6.92% (H, 6.62%); N, 8.02% (8.72%); IR (substance): ṽ/cm$^{-1}$=3053 (w), 2965 (m), 2918 (m), 2821 (w), 1657 (w), 1559 (m), 1507 (s), 1445 (m), 1427 (m), 1249

(m), 1222 (vs), 1167 (s), 1080 (m), 1040 (m), 1013 (m), 976 (m), 926 (w), 891 (w), 811 (m), 768 (m), 613 (m), 543 (w), 513 (w); TGA ($T_S$=25° C., $T_E$=700° C., 10° C./min, m=6.70 mg) steps: 1, T=154.8° C. (3% degradation), $T_D$(onset)=211.4° C., $T_D$(max)=252.9° C., total degradation: 5.75 mg (85.8%); SDTA ($T_S$=25° C., $T_E$=700° C., 10° C./min, m=6.70 mg) $T_M$(onset)=91.6° C., $T_M$(max)=95.4° C. (endothermic), $T_D$(onset)=not definable, $T_D$(max.)=not definable; verification of elemental ruthenium (Lit*: M. Cernohorsky, Acta Cryst. 1960, 13, 823-826): XRPD (residue from TGA analysis) $2\Theta_{Lit*}/°$ ($2\Theta_{obs}/°$): 38.39 (38.37), 43.72 (42.13), 44.01 (43.99), 58.33 (58.35), 69.41 (69.37), 78.30 (78.36), 82.22 (n/d), 84.71 (84.57), 85.96 (85.77), 92.04 (n/d), 97.09 (n/d).

Exemplary Embodiment 3: Preparation of [Ru(Anisole)($^{Me2N}$DAD)]

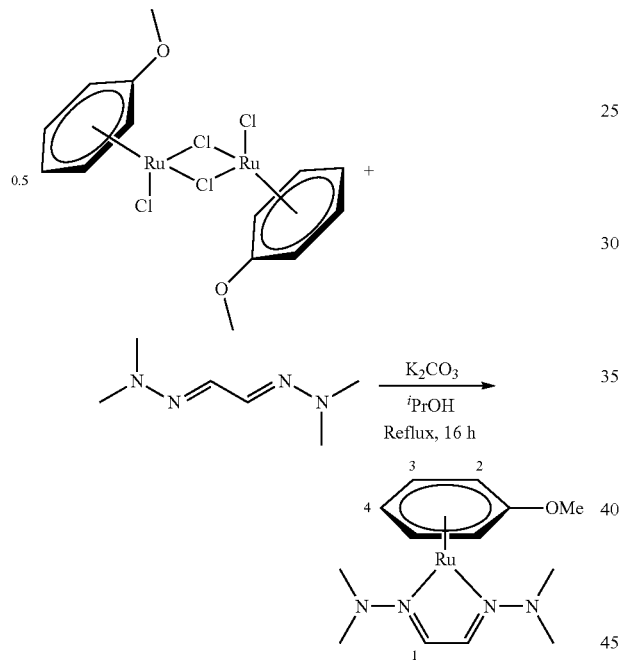

Under protective gas conditions, [RuCl$_2$(anisole)]$_2$ (500 mg, 0.89 mmol, 1.0 eq), glyoxal(bis-dimethylaminoimine) (254 mg, 1.79 mmol, 2.0 eq) and K$_2$CO$_3$ (1.48 g, 10.7 mmol, 6.0 eq) were absorbed into iPrOH (10 ml) and stirred for 16 hours under reflux conditions. After removing all volatile components in a vacuum, the residue was absorbed in nhexane (15 ml) and filtered by means of Celite®. In the process, the filter cake was extracted with additional amounts of nhexane (20 ml). The solvent was removed from the filtrate in a vacuum and volatile impurities were removed by means of sublimation (fine vacuum, 40° C.). [Ru(anisole)($^{Me2N}$DAD)] was obtained as the residue in the form of a red crystalline solid (83.0 mg, 0.24 mmol, 27%).

$^1$H-NMR (C$_6$D$_6$, 300.2 MHz): δ/ppm=7.31 (s, 2H, H-1), 5.33 (d, $^3J_{HH}$=5.3 Hz, 2H, H-2), 4.87 (t, $^3J_{HH}$=5.1 Hz, 1H, H-4), 4.65 (t, $^3J_{HH}$=5.7 Hz, 2H, H-3), 3.29 (s, 3H, OMe), 2.75 (s, 12H, NMe$_2$); $^{13}$C-NMR (C$_6$D$_6$, 75.5 MHz): δ/ppm=130.4 (C-1), 73.8 (C-4), 72.4 (C-3), 66.6 (C-2), 56.4 (OMe), 48.1 (NMe$_2$); HR-EI(+)-MS: calculated for [M]+=352.0827 m/z, found: 352.0845 m/z; elemental analysis: calculated for C$_{13}$H$_{22}$N$_4$ORu (351.42 g/mol): calculated (found): C, 44.43% (45.63%); H, 6.31% (H, 6.28%); N, 15.94% (15.39%); IR (substance): $\tilde{v}$/cm$^{-1}$=3046 (w), 2973 (w), 2933 (m), 2853 (m), 2812 (m), 2771 (m), 1508 (m), 1435 (s), 1267 (m), 1227 (vs), 1169 (m), 1130 (m), 1009 (s), 919 (m), 886 (m), 858 (m), 814 (m), 769 (m), 738 (m), 637 (w), 614 (w), 553 (w) 473 (w), 447 (w) 417 (w); TGA ($T_S$=25° C., $T_E$=700° C., 10° C./min, m=11.5 mg) steps: 2, T=177.1° C. (3% degradation), step 1: T(onset)=182.2° C., T(max)=239.9° C., step 2: T(onset)=460.8° C., T(max)=508.3° C., total degradation: 8.26 mg (71.8%); SDTA ($T_S$=25° C., $T_E$=700° C., 10° C./min, m=11.5 mg) $T_M$(onset)=60.1° C., $T_M$(max)=70.2° C. (endothermic), $T_{D1}$(onset)=217.2° C., $T_{D1}$(max)=239.6° C. (exothermic), $T_{D2}$(onset)=483.5° C., $T_{D2}$(max)=516.2° C. (exothermic);

verification of elemental ruthenium (Lit *: M. Cernohorsky, Acta Cryst. 1960, 13, 823-826): XRPD (residue from TGA analysis) $2\Theta_{Lit*}/°$ ($2\Theta_{obs}/°$): 38.39 (38.34), 43.72 (42.09), 44.01 (43.99), 58.33 (58.26), 69.41 (69.37), 78.30 (78.28), 82.22 (n/d), 84.71 (84.68), 85.96 (85.87), 92.04 (n/d), 97.09 (n/d).

Exemplary Embodiment 4: Preparation of [Ru(Benzene)($^{iPr}$DAD)]

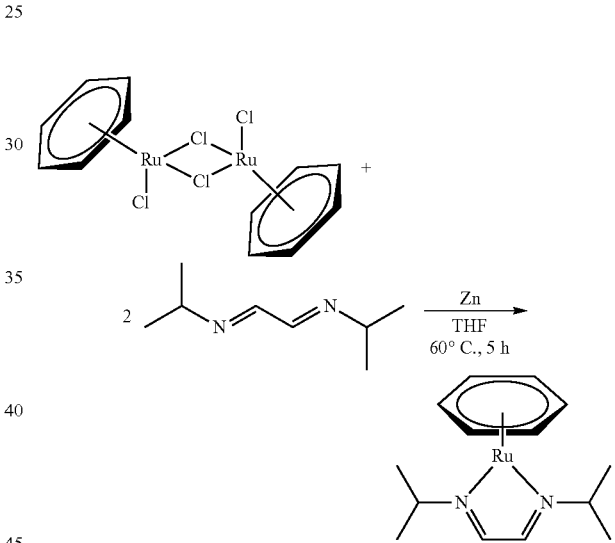

[RuCl$_2$(benzene)]$_2$ (800 mg, 1.60 mmol, 1.0 eq) and zinc powder (418 mg, 6.40 mmol, 4.0 eq) were provided in THF (30 ml) and mixed with $^{iPr}$DAD (673 mg, 4.80 mmol, 3.0 eq) while stirring. The mixture was stirred for 5 hours at 60° C., wherein a dark red color was observed. After removing all volatile components in a vacuum, the residue was absorbed in toluene (15 ml), stirred for one hour at room temperature and then filtered by means of Celite®. In the process, the solid was extracted several times with toluene (40 ml) until reddish filtrate was no longer obtained. After the filtrate had dried in the vacuum, the target compound was condensed out of the resulting residue in a dynamic fine vacuum at an oil bath temperature of 120° C. [Ru(benzene)($^{iPr}$DAD)] was obtained as a dark red liquid (466 mg, 1.46 mmol, 46%), which ultimately completely crystallized and was present as a solid at room temperature.

$^1$H-NMR (C$_6$D$_6$, 300.2 MHz): δ/ppm=7.05 (s, 2H, H-1), 4.83 (s, 6H, benzene), 4.39 (sept, 2H, iPr), 1.41 (d, $^3J_{HH}$=6.8 Hz, 12H, iPr); $^{13}$C-NMR (C$_6$D$_6$, 75.5 MHz): δ/ppm=131.5 (C-1), 74.9 (benzene), 63.4 (Pr), 24.9 (iPr); HR-EI-MS: calculated for [M]+=320.0827 m/z, found: 320.0805 m/z;

elemental analysis: $C_{14}H_{22}N_2Ru$ (319.41 g/mol), calculated: C, 52.64%; H, 6.94%; N, 8.77%, found: C, 52.65%; H, 6.89%; N, 8.98%; IR (substance): $\tilde{v}/cm^{-1}$=3047 (w), 2959 (m), 2922 (m), 2859 (m), 1838 (w), 1726 (m), 1641 (w), 1510 (m), 1433 (m), 1353 (m), 1276 (m), 1247 (s), 1216 (vs), 1168 (s), 1118 (s), 1072 (m), 996 (m), 904 (m), 793 (m), 718 (s), 614 (m), 546 (m); TGA ($T_S$=25° C., $T_E$=700° C., 10° C./min, m=12.0 mg) steps: 1, T=185.8° C. (3% degradation), $T_D$(onset)=222.8° C., $T_D$(max)=268.4° C., total degradation: 11.8 mg (98.0%); SDTA ($T_S$=25° C., $T_E$=900° C., 10° C./min, m=12.0 mg): $T_M$(onset)=101.6° C., $T_M$(max.)=106.7° C. (endothermic), $T_D$(onset)=250° C., $T_D$(max)=271.1° C. (exothermic).

Exemplary Embodiment 5: Preparation of [Ru(benzene)($^{Me2N}$DAD)]

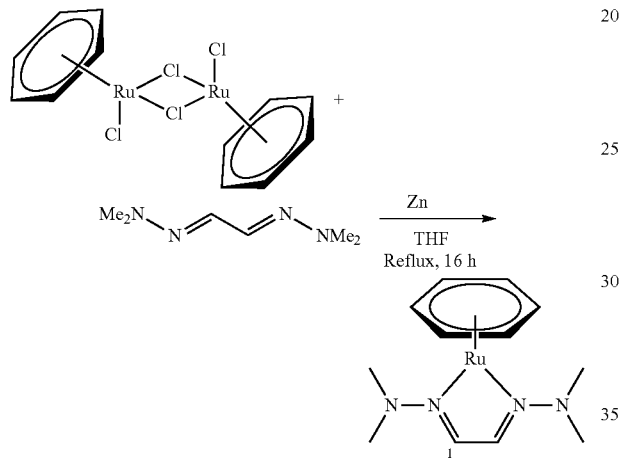

[RuCl$_2$(benzene)]$_2$ (400 mg, 0.80 mmol, 1.0 eq) and zinc powder (209 mg, 3.20 mmol, 4.0 eq) were provided in THF (15 ml) and mixed with $^{Me2N}$DAD (227 mg, 1.60 mmol, 2.0 eq) in THF (5 ml) while stirring. The mixture was stirred for 5 hours at 60° C., wherein a change of color to dark red was observed. After removing all volatile components in a vacuum, the residue was absorbed in toluene (15 ml), stirred for one hour at room temperature and then filtered by means of Celite®. In the process, the solid was extracted several times with toluene (40 ml) until reddish filtrate was no longer obtained. After the filtrate had dried in the vacuum, the target compound was condensed out of the resulting residue in a dynamic fine vacuum at an oil bath temperature of 120° C. [Ru(benzene)($^{Me2N}$DAD)] was obtained as a dark red liquid (153 mg, 0.48 mmol, 60%), which ultimately completely crystallized and was present as a solid at room temperature.

In the SDTA experiment obtained, two endothermic peaks were found, both of which could indicate a melting point. By means of optical melting point determination, the second peak could be clearly assigned to such a process, whereas no change of the sample was detectable in the temperature range of the first peak.

$^1$H-NMR (C$_6$D$_6$, 300.2 MHz): δ/ppm=7.31 (s, 2H, H-1), 5.19 (s, 6H, H-arom.), 2.71 (s, 12H, NMe$_2$); $^{13}$C-NMR (C$_6$D$_6$, 75.5 MHz): δ/ppm=131.2 (C-1), 75.7 (C-arom.), 48.1 (NMe$_2$); HR-EI-MS: calculated for [M]+=322.0731 m/z, found: 322.0733 m/z; elemental analysis: $C_{12}H_{20}N_4Ru$ (321.39 g/mol), calculated: C, 44.85%; H, 6.27%; N, 17.43%, found: C, 44.84%; H, 6.26%; N, 17.85%; IR (substance): $\tilde{v}/cm^{-1}$=2936 (m), 2829 (m), 2798 (m), 2756 (m), 1648 (w), 1501 (m), 1448 (m), 1429 (s), 1256 (s), 1227 (m), 1205 (m), 1139 (m), 966 (s), 909 (m), 865 (m), 797 (vs), 712 (s), 684 (m), 599 (m), 541 (w), 457 (w), 413 (m); TGA ($T_S$=25° C., $T_E$=700° C., 10° C./min, m=12.3 mg) steps: 2, T=1922° C. (3% degradation), step 1: $T_{D1}$(onset)=221.2° C., $T_{D1}$(max.)=258.5° C., step 2: $T_{D2}$(onset)=465.4° C., $T_{D2}$(max.)=507.4° C., total degradation: 9.01 mg (81.2%); SDTA ($T_S$=25° C., $T_E$=700° C., 10° C./min, m=12.3 mg): T(onset)=56.8° C., T(max.)=60.0° C. (endothermic), $T_M$(onset)=84.2° C., $T_M$(max.)=86.5° C. (endothermic), $T_{D1}$(onset)=224.7° C., $T_{D1}$(max)=246.1° C. (exothermic); melting point determination: (N$_2$, $T_S$=50° C., $T_E$=100° C., 2° C./min): $T_M$=85.3° C.; verification of elemental ruthenium (Lit *: M. Cernohorsky, Acta Cryst. 1960, 13, 823-826): XRPD (residue from TGA analysis) 2Θ$_{Lit*}$/° (2Θobs/°): 38.39 (38.61), 43.72 (42.27), 44.01 (43.89), 58.33 (58.27), 69.41 (69.22), 78.30 (78.36), 82.22 (n/d), 84.71 (84.66), 85.96 (85.41), 92.04 (n/d), 97.09 (n/d).

Exemplary Embodiment 6: Preparation of [Ru(mesitylene)($^{iPr}$DAD)]

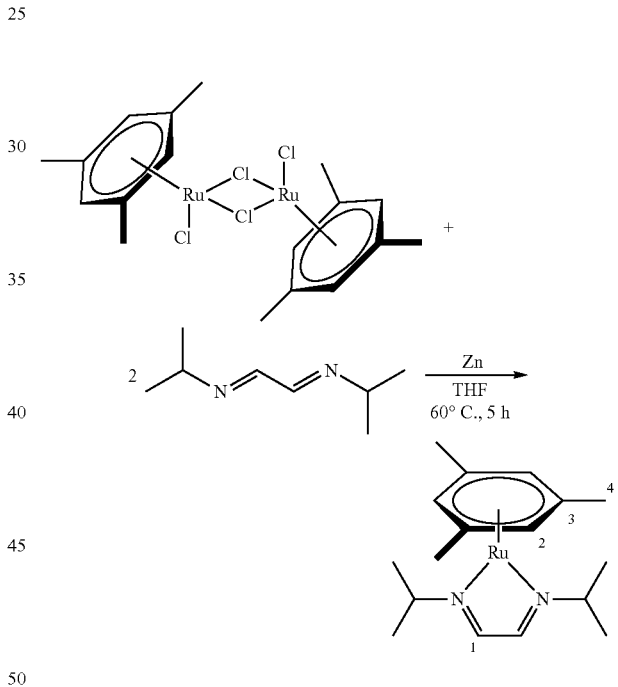

[RuCl$_2$(mesitylene)]$_2$ (800 mg, 1.37 mmol, 1.0 eq) and zinc powder (358 mg, 5.48 mmol, 4.0 eq) were provided in THF (15 ml) and mixed with iPrDAD (576 mg, 4.11 mmol, 3.0 eq) while stirring. The mixture was stirred for 5 hours at 60° C., wherein a dark red color was observed. After removing all volatile components in a vacuum, the residue was absorbed in toluene (20 ml) and filtered by means of Celite®. In the process, the solid was extracted several times with toluene (40 ml) until reddish filtrate was no longer obtained. After the filtrate had dried in the vacuum, the target compound was condensed out of the resulting residue in a dynamic fine vacuum at an oil bath temperature of 120° C. Ru(mesitylene)($^{iPr}$DAD)] was obtained as an orange-red liquid (305 mg, 0.84 mmol, 31%), which ultimately completely crystallized and was present at room temperature as an orange-colored solid.

$^1$H-NMR (C$_6$D$_6$, 300.2 MHz: δ/ppm=7.06 (s, 2H, CHCH), 4.76 (s, 3H, H-2), 4.53 (sept, 2H, iPr), 2.04 (s, 9H, H-3), 1.44 (d, $^3$J$_{HH}$=6.8 Hz, 12H, iPr); $^{13}$C-NMR (C$_6$D$_6$, 75.5 MHz): δ/ppm=129.4 (C-1), 85.8 (C-3), 78.1 (C-2), 61.4 (iPr), 24.7 (iPr), 20.3 (C-4); HR-EI-MS: calculated for [M]+=362.1296 m/z, found: 362.1313 m/z; elemental analysis: C$_{17}$H$_{28}$N$_2$Ru (361.50 g/mol), calculated: C, 56.48%; H, 7.81%; N, 7.75%, found: C, 56.04%; H, 7.61%; N, 8.23%; IR (substance): ṽ/cm$^{-1}$=2963 (m), 2917 (w), 2859 (w), 1635 (w), 1516 (m), 1441 (m), 1371 (w), 1244 (s), 1217 (vs), 1166 (m), 1028 (m), 984 (m), 874 (m), 712 (vs), 615 (w), 564 (w), 509 (w), 475 (w).

Exemplary Embodiment 7: Preparation of [Ru(mesitylene)($^{Me2N}$DAD)]

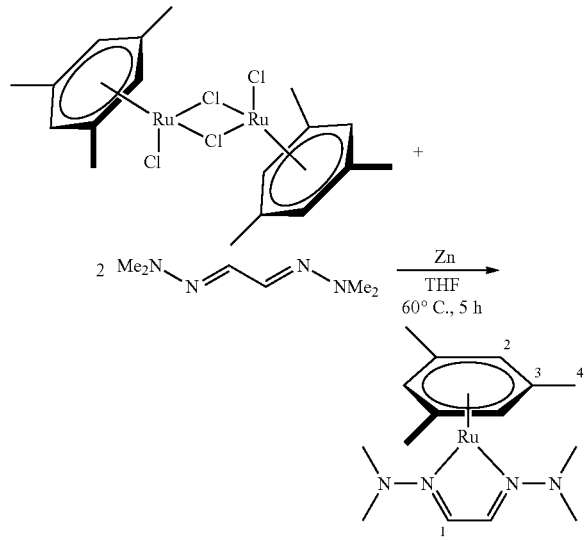

[RuCl$_2$(mesitylene)]$_2$ (800 mg, 1.37 mmol, 1.0 eq) and zinc powder (358 mg, 5.48 mmol, 4.0 eq) were provided in THF (15 ml) and mixed with $^{Me2N}$DAD (576 mg, 4.11 mmol, 3.0 eq) in THF (5 ml) while stirring. The mixture was stirred for 5 hours at 60° C., wherein a dark red color was observed. After removing all volatile components in a vacuum, the residue was absorbed in toluene (20 ml) and filtered by means of Celite®. In the process, the solid was extracted several times with toluene (30 ml) until reddish filtrate was no longer obtained. After the filtrate had dried in the vacuum, the target compound was condensed out of the residue in a dynamic fine vacuum at an oil bath temperature of 120° C. [Ru(mesitylene)($^{Me2N}$DAD)] was obtained as an orange-red liquid (332 mg, 0.92 mmol, 34%), which ultimately completely crystallized and was present at room temperature as an orange-colored solid.

$^1$H-NMR (C$_6$D$_6$, 300.2 MHz): δ/ppm=7.13 (s, 2H, H-1), 4.95 (s, 3H, H-2), 2.75 (s, 12H, NMe$_2$), 2.17 (s, 9H, H-4); $^{13}$C-NMR (C$_6$D$_6$, 75.5 MHz9: δ/ppm=125.7 (C-1), 87.9 (C-3), 79.1 (C-2), 47.2 (NMe$_2$), 20.5 (C-4); HR-EI-MS: calculated for [M]+=364.1201 m/z, found: 364.1204 m/z; elemental analysis: C$_{15}$H$_{26}$N$_4$Ru (363.47 g/mol), calculated: C, 49.57%; H, 7.21%; N, 15.41%; found: C, 48.51%; H, 7.13%; N, 16.10%; IR (substance): ṽ/cm$^{-1}$=2972 (m), 2934 (m), 2862 (m), 2832 (m), 2799 (m), 2761 (m), 1504 (m), 1445 (s), 1371 (m), 1235 (m), 1199 (m), 1150 (m), 1031 (m), 995 (m), 853 (s), 678 (vs), 567 (w), 567 (m), 510 (m).

Exemplary Embodiment 8: Preparation of [Ru(p-cymene)($^{iPr}$DAD)]

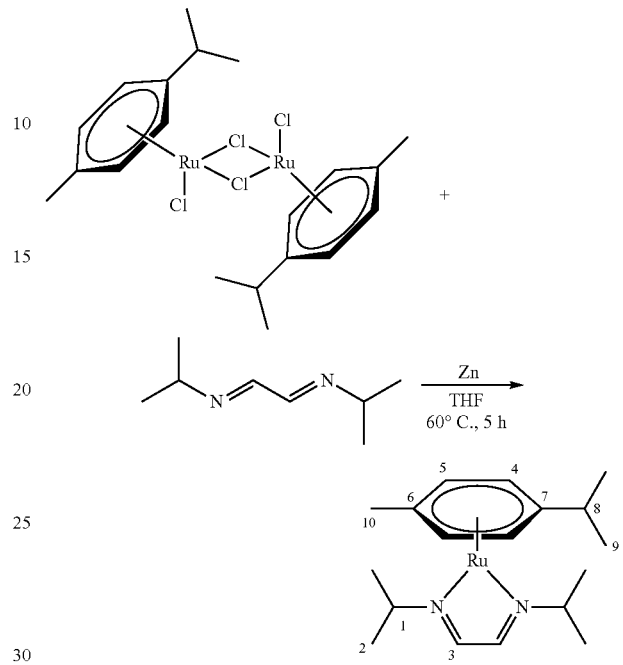

[RuCl$_2$(p-cymene)]$_2$ (1.00 g, 1.63 mmol, 1.0 eq) and zinc powder (426 mg, 6.53 mmol, 4.0 eq) were provided in a protective gas flask and mixed with THF (30 ml). iPrDAD (916 mg, 6.53 mmol, 4.0 eq) was added while stirring and the mixture was stirred for five hours at 60° C., wherein a dark red color was observed. After removing all volatile components in a vacuum, the residue was absorbed in toluene (20 ml), stirred for one hour at room temperature and then filtered by means of Celite®. In the process, the solid was extracted several times with toluene (50 ml) until reddish filtrate was no longer obtained. After the filtrate had dried in the vacuum, the target compound was isolated from the residue by means of recondensation in a fine vacuum at an oil bath temperature of 120° C. [Ru(p-cymene)($^{iPr}$DAD)] was obtained as a dark red liquid (413 mg, 1.13 mmol, 35%), which ultimately completely crystallized and was present as a solid at room temperature.

$^1$H-NMR (C$_6$D$_6$, 300.2 MHz): δ/ppm=7.03 (s, 2H, H-3), 4.62 (s, 4H, H-4, H-5), 4.49 (sept, 2H, H-1), 2.43 (sept, 1H, H-8), 2.10 (s, 3H, H-10), 1.45 (d, $^3$J$_{HH}$=6.7 Hz, 12H, H-2), 1.15 (d, $^3$J$_{HH}$=6.7 Hz, 6H, H-9); $^{13}$C-NMR (C$_6$D$_6$, 75.5 MHz): δ/ppm=130.5 (C-3), 100.5 (C-7), 88.6 (C-6), 75.4 (C-5), 73.4 (C-4), 62.9 (C-1), 32.6 (C-8), 24.8 (C-2), 21.1 (C-10); HR-EI(+)-MS: calculated for [M]+=376.1453 m/z, found: 376.1443 m/z; elemental analysis: C$_{16}$H$_{28}$N$_4$Ru (377.50 g/mol), calculated: C, 57.57%; H, 8.05%; N, 7.46%, found: C, 57.48%; H, 7.87%; N, 7.99%; IR (substance): ṽ/cm$^{-1}$=3077 (w), 3049 (w), 2959 (s), 2921 (m), 2860 (m), 1815 (w), 1632 (w), 1517 (m), 1439 (m), 1372 (m), 1354 (m), 1319 (m), 1243 (s), 1216 (vs), 1164 (s), 1140 (m), 1114 (m), 1081 (m), 1044 (m), 905 (m), 859 (m), 834 (m), 795 (m), 717b (vs), 636 (m), 613 (m), 544 (m), 420 (w); TGA (T$_S$=25° C., T$_E$=700° C., 10° C./min, m=11.8 mg) steps: 1, T=185.6° C. (3% degradation), T$_D$(onset)=229.4° C., T$_D$(max.)=266.9° C., total degradation: 11.5 mg (97.1%);

SDTA (T$_S$=25° C., T$_E$=700° C., 10° C./min, m=11.8 mg): T$_M$(onset)=38.0° C., T$_M$(max.)=42.3° C. (endothermic), T$_D$(onset)=n/d, T$_D$(max)=168.3° C. (exothermic).

Exemplary Embodiment 9: Preparation of [Ru(p-cymene)($^{Me2N}$DAD)]

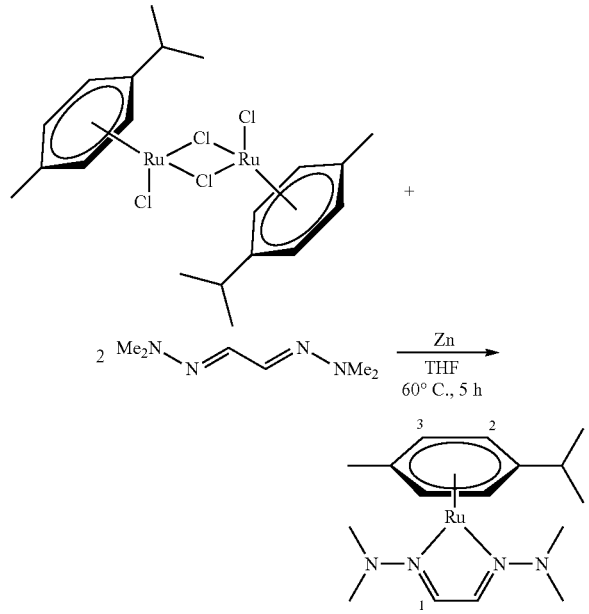

[RuCl$_2$(p-cymene)]$_2$ (40.0 g, 65.3 mmol, 1.0 eq) and zinc (20.0 g, 306 mmol, 4.7 eq) were provided in a protective gas flask and mixed with THF (200 ml). $^{Me2N}$DAD (37.15 g, 261 mmol, 4.0 eq) was added while stirring and the mixture was stirred for five hours at 60° C., wherein a dark red color was observed. After removing all volatile components in a vacuum, the residue was absorbed in toluene (100 ml), stirred for one hour at room temperature and then filtered by means of Celite®. In the process, the solid was extracted several times with toluene (600 ml) until reddish filtrate was no longer obtained. After the filtrate had dried in a vacuum, the target compound was isolated by means of an ether bridge in a fine vacuum at an oil bath temperature of 120° C. [Ru(p-cymene)($^{Me2N}$DAD)] was obtained as a dark red liquid (30.8 g, 81.6 mmol, 62%), which ultimately completely crystallized and was present as a solid at room temperature.

$^1$H-NMR (C$_6$D$_6$, 300.2 MHz): δ/ppm=7.22 (s, 2H, H-1), 5.08 (s, 4H, H-2, H-3), 2.78 (s, 12H, NMe$_2$), 2.52 (sept, 1H, iPr), 2.13 (s, 3H, Me), 1.15 (d, $^3J_{HH}$=7.1 Hz, 6H, iPr); $^{13}$C-NMR (C$_6$D$_6$, 75.5 MHz): δ/ppm=129.5 (C-1), 101.9 (Cq), 90.2 (Cq), 76.5 (C-3), 74.5 (C-2), 48.0 (NMe$_2$), 32.8 (iPr), 24.8 (iPr), 21.2 (Me); HR-EI(+)-MS: calculated for [M]+=378.1357 m/z, found: 378.1352 m/z; elemental analysis: C$_{16}$H$_{28}$N$_4$Ru (377.50 g/mol), calculated: C, 50.91%; H, 7.48%; N, 14.84%, found: C, 50.94%; H, 7.27%; N, 15.05%; IR (substance) ṽ/cm$^{-1}$=2959 (m), 2926 (m), 2840 (m), 2804 (m), 2759 (m), 1727 (w), 1648 (w), 1507 (m), 1435 (s), 1379 (m), 1355 (m), 1355 (m), 1316 (m), 1269 (vs), 1192 (m), 1141 (m), 1081 (m), 1026 (m), 924 (m), 865 (m), 840 (s), 796 (m), 720 (vs), 689 (m), 655 (w), 639 (w), 470 (w); TGA (T$_S$=25° C., T$_E$=600° C., 10° C./min, m=12.3 mg) steps: 2, T=186.8° C. (3% degradation), T$_{D1}$(onset)=217.0° C., T$_{D1}$(max.)=245.0° C. (71.0%), T$_{D2}$(onset)=456.0° C., T$_{D2}$(max.)=502.5° C. (5.89%), total degradation: 9.45 mg (76.9%), SDTA (T$_S$=25° C., T$_E$=600° C., 10° C./min, m=12.3 mg): T$_M$(onset)=54.7° C., T$_M$(max.)=59.1° C. (endothermic), T$_{D1}$(onset)=214.2° C., T$_{D1}$(max)=237.2° C. (exothermic);

verification of elemental ruthenium (Lit *: M. Cernohorsky, Acta Cryst. 1960, 13, 823-826): XRPD (residue from TGA analysis) 2Θ$_{Lit*}$)(2Θobs/°): 38.39 (38.38), 43.72 (42.15), 44.01 (43.99), 58.33 (58.30), 69.41 (69.37), 78.30 (78.34), 82.22 (n/d), 84.71 (84.65), 85.96 (85.92), 92.04 (n/d), 97.09 (n/d).

The invention is not limited to one of the embodiments described above but may be modified in many ways.

It is recognized that the invention relates to compounds in accordance with the general formula [Ru(arene)(R$^a$—N═CR$^1$—CR$^3$═N—R$^b$)] or [Ru(arene)((R$^c$,R$^d$)N—N═CR$^{H1}$—CR$^{H3}$═N—N(R$^e$,R$^f$))]. In this case, arene is selected from the group consisting of mononuclear and polynuclear arenes and mononuclear and polynuclear heteroarenes. R$^1$, R$^3$, R$^{H1}$, R$^{H3}$ and R$^a$-R$^f$ are independently selected from the group consisting of H, an alkyl radical (C1-C10) and an aryl radical. It further relates to methods for the production of these compounds, compounds obtainable according to these methods, their use and a substrate having on a surface thereof a ruthenium layer or a layer containing ruthenium. In addition, the invention relates to a method for producing compounds [Ru(arene)X$_2$]$_2$, wherein arene is selected from the group consisting of mononuclear and polynuclear arenes and X=halogen, compounds of this type obtainable according to this method, and their use.

Using the method described above, the aforementioned ruthenium(0) compounds can be prepared in a simple, cost-effective and reproducible manner with a high degree of purity and a good yield. The production methods can also be carried out on an industrial scale. Due to their high degree of purity, the aforementioned embodiments of the ruthenium (0) complexes claimed are suitable for use as ruthenium(0) precursors. Advantageously, only a small amount of material is required to deposit a ruthenium(0) layer or a layer containing ruthenium(0).

All features and advantages resulting from the claims, the description and the figures, including constructive details, spatial arrangements and method steps, can be essential to the invention, both in and of themselves and in the most diverse combinations.

The invention claimed is:
1. Compounds
in accordance with the general formula

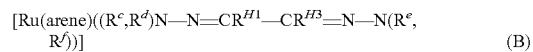

[Ru(arene)((R$^c$,R$^d$)N—N═CR$^{H1}$—CR$^{H3}$═N—N(R$^e$, R$^f$))]  (B)

wherein
i) arene is selected from the group consisting of mononuclear and polynuclear arenes and mononuclear and polynuclear heteroarenes
and
ii) R$^{H1}$, R$^{H3}$, R$^c$, R$^d$, R$^e$ and R$^f$ are independently selected from the group consisting of H, an alkyl radical (C1-C10) and an aryl radical.

2. Compounds in accordance with the general formula B according to claim 1,
wherein
R$^{H1}$, R$^{H3}$ are independently selected from the group consisting of
H, an alkyl radical (C1-C10) and an aryl radical and
$R^c = R^e =$ H, alkyl radical (C1-C10) or aryl radical
and
$R^d = R^f =$ H, alkyl radical (C1-C10) or aryl radical.

3. Compounds in accordance with the general formula B according to claim 1,
wherein
$R^{H1}$, $R^{H3}$ are independently selected from the group consisting of
H, an alkyl radical (C1-C10) and an aryl radical
and
$R^c = R^d = R^e = R^f =$ H, alkyl radical (C1-C10) or aryl radical.

4. Compounds in accordance with the general formula B according to claim 1,
wherein
$R^{H1} = R^{H3} =$ H, alkyl radical (C1-C10) or aryl radical
and
$R^c = R^e =$ H, alkyl radical (C1-C10) or aryl radical
and
$R^d = R^f =$ H, alkyl radical (C1-C10) or aryl radical.

5. Compounds in accordance with the general formula B according to claim 1,
wherein
$R^{H1} = R^{H3} =$ H, alkyl radical (C1-C10) or aryl radical
and
$R^c = R^d = R^e = R^f =$ H, alkyl radical ($C_1$-C10) or aryl radical.

6. Method for producing a compound
in accordance with the general formula $$[Ru(arene)((R^c,R^d)N\text{---}N\text{=}CR^{H1}\text{---}CR^{H3}\text{=}N\text{---}N(R^e,R^f))] \quad (B)$$

wherein
i) arene is selected from the group consisting of mononuclear and polynuclear arenes and mononuclear and polynuclear heteroarenes
and
ii) $R^{H1}$, $R^{H3}$, $R^c$, $R^d$, $R^e$ and $R^f$ are independently selected from the group consisting of H, an alkyl radical (C1-C10) and an aryl radical
comprising the following steps:
a) providing a compound
in accordance with the general formula $[Ru(arene)X_2]_2$ (C),
wherein
X=halogen and
arene is selected from the group consisting of mononuclear and polynuclear arenes and mononuclear and polynuclear heteroarenes,
b) reacting $[Ru(arene)X_2]_2$ with $M^A{}_2CO_3$ or $M^ECO_3$,
wherein $M^A$=alkali metal and $M^B$=alkaline earth metal, and
a ligand in accordance with the general formula $$(R^c,R^d)N\text{---}N\text{=}CR^{H1}\text{---}CR^{H3}\text{=}N\text{---}N(R^e,R^f)$$

in a polar solvent.

7. Method according to claim 6, wherein
$M^A{}_2CO_3$ is used, wherein $M^A$=Li, Na or K,
or
$M^ECO_3$ is used, wherein $M^E$=Mg, Ca, Sr or Ba.

8. Method according to claim 6, wherein
the molar ratio
$[Ru(arene)X_2]_2:M^A{}_2CO_3$
or
$[Ru(arene)X_2]_2:M^ECO_3$
is between 1:2 and 1:10.

9. Method according to claim 6, wherein
the molar ratio
$[Ru(arene)X_2]_2:(R^c,R^d)N\text{---}N\text{=}CR^{H1}\text{---}CR^{H3}\text{=}N\text{---}N(R^e,R^f)$
is between 1:2 and 1:10.

10. Method according to claim 6, wherein the solvent is an alcohol, an ether, acetonitrile or acetone.

11. Method according to claim 6,
wherein the reaction mixture from step b) is heated,
wherein a temperature $T_1$ of the reaction mixture is between 20° C. and 160° C.

12. Method according to claim 6, wherein step b) is followed by step c), which comprises isolating $$[Ru(arene)((R^c,R^d)N\text{---}N\text{=}CR^{H1}\text{---}CR^{H3}\text{=}N\text{---}N(R^e,R^f))] \quad (B).$$

13. Compounds in accordance with the general formula $$[Ru(arene)((R^c,R^d)N\text{---}N\text{=}CR^{H1}\text{---}CR^{H3}\text{=}N\text{---}N(R^e,R^f))] \quad (B),$$

wherein
ii) arene is selected from the group consisting of mononuclear and
polynuclear arenes and mononuclear and polynuclear heteroarenes
and
ii) $R^{H1}$, $R^{H3}$, $R^c$, $R^d$, and $R^f$ are independently selected from the
group consisting of H, an alkyl radical (C1-C10) and an aryl radical, produced according to the method in accordance with claim 6.

14. Compounds according to claim 13,
wherein
arene is selected from the group consisting of
benzene, toluene, ethylbenzene, tert-butylbenzene, sec-butylbenzene, propylbenzene, isopropylbenzene, benzocyclopentane, 4-ethyl-toluene, ortho-xylene, meta-xylene, para-xylene, chlorobenzene, mesitylene, para-cymene, anisole, aniline, pyridine, pyridine derivatives, diazines, diazine derivatives, triazines and triazine derivatives.

15. A method for producing a semiconductor element or an electronic memory comprising utilizing the compound according to claim 1, in the production of the semiconductor element or an electronic memory.

* * * * *